United States Patent
Mehta et al.

(10) Patent No.: US 11,330,211 B2
(45) Date of Patent: May 10, 2022

(54) SOLID-STATE IMAGING DEVICE AND IMAGING DEVICE WITH COMBINED DYNAMIC VISION SENSOR AND IMAGING FUNCTIONS

(71) Applicant: Sony Semiconductor Solutions Corporation, Kanagawa (JP)

(72) Inventors: Giri Mehta, Rochester, NY (US); Pooria Mostafalu, Penfield, NY (US); Frederick Brady, Webster, NY (US); Ping Wah Wong, Rochester, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 217 days.

(21) Appl. No.: 16/700,281

(22) Filed: Dec. 2, 2019

(65) Prior Publication Data
US 2021/0168314 A1 Jun. 3, 2021

(51) Int. Cl.
| | |
|---|---|
| H04N 5/335 | (2011.01) |
| H04N 5/369 | (2011.01) |
| H01L 27/146 | (2006.01) |
| H04N 5/378 | (2011.01) |

(52) U.S. Cl.
CPC ....... *H04N 5/3696* (2013.01); *H01L 27/1463* (2013.01); *H01L 27/14641* (2013.01); *H01L 27/14645* (2013.01); *H01L 27/14689* (2013.01); *H04N 5/378* (2013.01)

(58) Field of Classification Search
CPC .. H04N 5/3696; H04N 5/378; H01L 27/1463; H01L 27/14641; H01L 27/14645; H01L 27/14689
USPC .................................................. 348/300
See application file for complete search history.

(56) References Cited

U.S. PATENT DOCUMENTS

| | | | |
|---|---|---|---|
| 2005/0285966 A1* | 12/2005 | Bamji | G01S 17/894 348/336 |
| 2007/0201859 A1* | 8/2007 | Sarrat | H04N 13/25 396/322 |
| 2012/0217601 A1* | 8/2012 | Miyanami | H04N 9/083 257/432 |

(Continued)

OTHER PUBLICATIONS

International Search Report and Written Opinion for International (PCT) Patent Application No. PCT/JP2020/044942, dated Feb. 26, 2021, 12 pages.

*Primary Examiner* — Usman A Khan
(74) *Attorney, Agent, or Firm* — Sheridan Ross P.C.

(57) ABSTRACT

An imaging device with a plurality of image sensing pixels and a plurality of event detection pixels is provided. Each image sensing pixel includes a photoelectric conversion element and an imaging signal generation readout circuit. The image sensing readout circuit can be shared by a plurality of photoelectric conversion elements. Each event detection pixel includes a photoelectric conversion element and an event detection readout circuit. The event detection readout circuit can be shared by a plurality of photoelectric conversion elements. In addition, the photoelectric conversion element of an event detection pixel can be selectively connected to a shared imaging signal generation readout circuit. The number of image sensing pixels is greater than the number of event detection pixels. In addition, the area of a photoelectric conversion element of an event detection pixel can be greater than the area of a photoelectric conversion element of an image sensing pixel.

21 Claims, 24 Drawing Sheets

(56) References Cited

U.S. PATENT DOCUMENTS

| | | | |
|---|---|---|---|
| 2015/0002713 A1* | 1/2015 | Nomura | H01L 27/1464 |
| | | | 348/302 |
| 2015/0302710 A1 | 10/2015 | Jin et al. | |
| 2016/0093664 A1* | 3/2016 | Solhusvik | H04N 5/3745 |
| | | | 257/229 |
| 2017/0154907 A1* | 6/2017 | Ogita | H01L 27/1462 |
| 2019/0051685 A1 | 2/2019 | Handa | |
| 2019/0296070 A1 | 9/2019 | Jin et al. | |

* cited by examiner

SOLID-STATE IMAGING DEVICE AND IMAGING DEVICE WITH COMBINED DYNAMIC VISION SENSOR AND IMAGING FUNCTIONS

TECHNICAL FIELD

The present disclosure relates to an imaging device with both dynamic vison sensor and imaging capabilities.

BACKGROUND

In the related art, a synchronization-type solid-state imaging device that captures image data in synchronization with a synchronization signal such as a vertical synchronization signal has been used in an imaging device and the like. In the typical synchronization-type solid-state imaging device, it is difficult to acquire image data for every period of the synchronization signal (for example, for every 1/60 seconds), and thus it is difficult to cope with cases in which relatively high-speed processing is demanded, such as in fields demanding high speed (e.g. real time) processing, such as autonomous vehicles, robotics, and the like. In this regard, there is suggested a non-synchronization-type solid-state imaging device in which a detection circuit is provided for every pixel to detect a situation in which a light-reception amount exceeds a threshold value as an address event in real time. The non-synchronization-type solid-state imaging device that detects the address event for every pixel is also referred to as a dynamic vision sensor (DVS).

SUMMARY

Technical Problem

A sensor with a combination of DVS and regular frame based imaging can be achieved using various methods. These include devices that feature time-based readout using additional photodiodes, known as asynchronous time-based image sensors (ATIS) systems. However, because ATIS systems require two photodiodes per pixel in order to provide image sensor and DVS signals, they suffer from degraded resolution and image quality as compared to arrangements that do not require additional photodiodes. Other devices feature pixels that provide image sensor signals and dynamic vision sensor (DVS) event signals using a common photodiode, known as dynamic and active pixel vision sensor (DAVIS) systems. However, DAVIS systems can suffer from decreased sensitivity due to the need to suppress interference between the image and event detection functions, as those functions are not well isolated. In addition, difficulty in readout of DVS and active image sensor signals can degrade the dynamic range of DAVIS sensors.

Therefore, the present disclosure provides a solid-state imaging device and an imaging device which are capable of providing both imaging and event detection functions with improved event detection capabilities and light-reception efficiency as compared to other configurations.

Solution to Problem

In accordance with embodiments and aspects of the present disclosure, there is provided an imaging device comprising a plurality of photoelectric conversion regions or pixels, also referred to herein as unit pixels, arranged in a pixel array. At least some of the pixels are configured as event detection pixels, while other of the pixels are configured as image sensing or capture pixels. In general, the event detection pixels are interspersed amongst the image capture pixels within the pixel array. In operation, the detection of an event by one or more event detection pixels in trigger operation of the image sensing pixels.

Each pixel includes a single photoelectric conversion region and an associated readout circuit. More particularly, each image sensing pixel includes a photoelectric conversion region and a first readout circuit, also referred to herein as an imaging generation unit or circuit. Each event detection pixel includes a photoelectric conversion region and a second readout circuit, also referred to herein as an event detection circuit.

In accordance with at least some embodiments and aspects of the present disclosure, each event detection pixel occupies a larger area of the pixel array than any one image sensing pixel. As an example, but without limitation, each event detection pixel may occupy an area that is four times the area of each image sensing pixel. In accordance with other embodiments and aspects of the present disclosure, each event detection pixel may occupy an area that is equal to the area of each image sensing pixel. In accordance with still further embodiments of the present disclosure, different ratios of image sensing pixels to event detection pixels can be included within the pixel array. As examples, but without limitation, the ratio can be 3:1, 4:1, 12:1, 15:1, 32:1, or 35:1. In accordance with at least some embodiments and aspects of the present disclosure, a ratio of any area of the photoelectric conversion region of each event detection pixel occupies a larger area within the plane of the pixel array.

In accordance with still further embodiments and aspects of the present disclosure, isolation structures are provided to isolate at least some of the unit pixels from other unit pixels. For example, full thickness dielectric trench (RFTI) isolation structures can be formed around each of the event detection pixels. As a further example, rear deep trench isolation (RDTI) isolation structures can be formed around least portions of the image sensing pixels, to provide isolation between adjacent image sensing pixels. In accordance with still other embodiments and aspects of the present disclosure, at least to some readout circuit elements can be shared by multiple photoelectric conversion regions. For example, a group of image sensing pixels may share readout circuit elements. As an example, but without limitation, the group of image sensing pixels may be in the form of a Bayer array. In accordance with still other embodiments of the present disclosure, some or all of the event detection pixels may additionally function as image sensing pixels. Moreover, in such embodiments, image sensor readout circuit elements and event detection circuit elements within a group of event detection pixels can be shared. As an example, but without limitation, such a group of event detection pixels may be in the form of a Bayer array.

The present disclosure can provide imaging devices with dynamic vision sensing and imaging capabilities that are capable of improved light-reception efficiencies.

BRIEF DESCRIPTION OF DRAWINGS

FIG. 24 is a plan view of a combined event detection and image sensing pixel in accordance with the third exemplary embodiment in.

DESCRIPTION OF EMBODIMENTS

Figure 1:
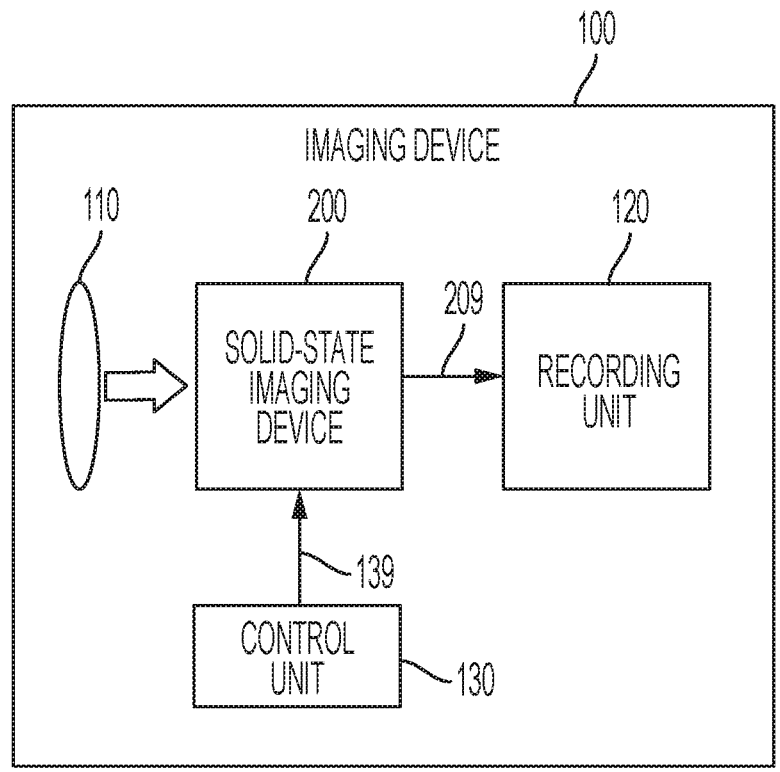
FIG. 1 is a block diagram illustrating a schematic configuration example of a solid-state imaging device in accordance with embodiments of the present disclosure.

Hereinafter, embodiments of the present disclosure will be described in detail on the basis of the accompanying drawings. Furthermore, in the following embodiments, the same reference numeral will be given to the same portion, and redundant description thereof will be omitted.

A typical dynamic vision sensor (DVS) employs a so-called event-driven type driving method in which the existence or nonexistence of address event ignition is detected for every unit pixel, and a pixel signal is read out from a unit pixel in which the address event ignition is detected.

Furthermore, the unit pixel in this description represents a minimum unit of a pixel or unit pixel including one photoelectric conversion element (also referred to as "light-receiving element"), and can correspond to each dot in image data that is read out from an image sensor as an example. In addition, the address event represents an event that occurs for every address that is allocable to each of a plurality of the unit pixels which are arranged in a two-dimensional lattice shape. An event detection sensor responds to a change in intensity asynchronously. Intensity change is correlated with a change in photocurrent, and if this change exceeds a constant threshold value it could be detected as an event.

FIG. 1 is a block diagram illustrating a schematic configuration example of an imaging device according to at least some embodiments of the present disclosure. As illustrated in FIG. 1, for example, an imaging device 100 includes an imaging lens 110, a solid-state imaging device 200, a recording unit 120, and a control unit 130. As examples, the imaging device 100 can be provided as or as part of a camera that is mounted in an industrial robot, an in-vehicle camera, or as part of or in connection with other devices or instruments.

The imaging lens 110 can include an optical system that directs (e.g. condenses) incident light and images an image of the incident light on a light-receiving surface of the solid-state imaging device 200, also referred to herein as simply an imaging device 200. The light-receiving surface is a surface of a substrate on which photoelectric conversion elements in the solid-state imaging device 200 are arranged. The solid-state imaging device 200 photoelectrically converts the incident light to generate image data. In addition, the solid-state imaging device 200 can execute predetermined signal processing such as noise removal and white balance adjustment with respect to the generated image data. A result obtained by the signal processing and a detection signal indicating the existence or nonexistence of an address event ignition are output to the recording unit 120 through a signal line 209. Furthermore, a method of generating the detection signal indicating the existence or nonexistence of the address event ignition will be described later.

The recording unit 120 is, for example, constituted by a flash memory, a dynamic random access memory (DRAM), a static random access memory (SRAM), or the like, and records data input from the solid-state imaging device 200.

The control unit 130 is, for example, constituted by a central processing unit (CPU) and the like, and outputs various instructions through a signal line 139 to control respective units such as the solid-state imaging device 200 in the imaging device 100.

Next, a configuration example of the solid-state imaging device 200 will be described in detail with reference to the accompanying drawings.

Figure 2:
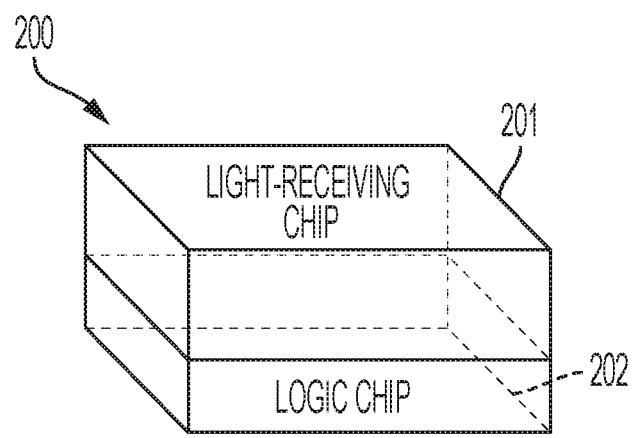
FIG. 2 is a view illustrating a lamination structure example of a solid-state imaging device according to in accordance with embodiments of the present disclosure.

FIG. 2 is a view illustrating a lamination structure example of a solid-state imaging device 200 in accordance with at least some embodiments of the present disclosure. As illustrated in FIG. 2, the solid-state imaging device 200 can have a structure in which a light-receiving chip 201 and a logic chip 202 are vertically laminated. In joining of the light-receiving chip 201 and the logic chip 202, for example, so-called direct joining in which joining surfaces of the chips are planarized, and the chips are laminated with an inter-electron force can be used. However, there is no limitation thereto, and for example, so-called Cu—Cu joining in which copper (Cu) electrode pads formed on joining surfaces are bonded, bump joining, and the like can also be used.

In addition, the light-receiving chip 201 and the logic chip 202 are electrically connected to each other, for example, through a connection portion such as a through-silicon via (TSV) that penetrates through a semiconductor substrate. In the connection using the TSV, for example, a so-called twin TSV method in which two TSVs including a TSV that is formed in the light-receiving chip 201 and a TSV that is formed from the light-receiving chip 201 to the logic chip 202 are connected to each other on chip external surfaces, a so-called shared TSV method in which the light-receiving chip 201 and the logic chip 202 are connected with a TSV that penetrates through both the chips, and the like can be employed.

However, in the case of using the Cu—Cu joining or the bump joining in the joining of the light-receiving chip 201 and the logic chip 202, both the light-receiving chip 201 and the logic chip 202 are electrically connected to each other through a Cu—Cu joint or a bump joint.

Figure 3:
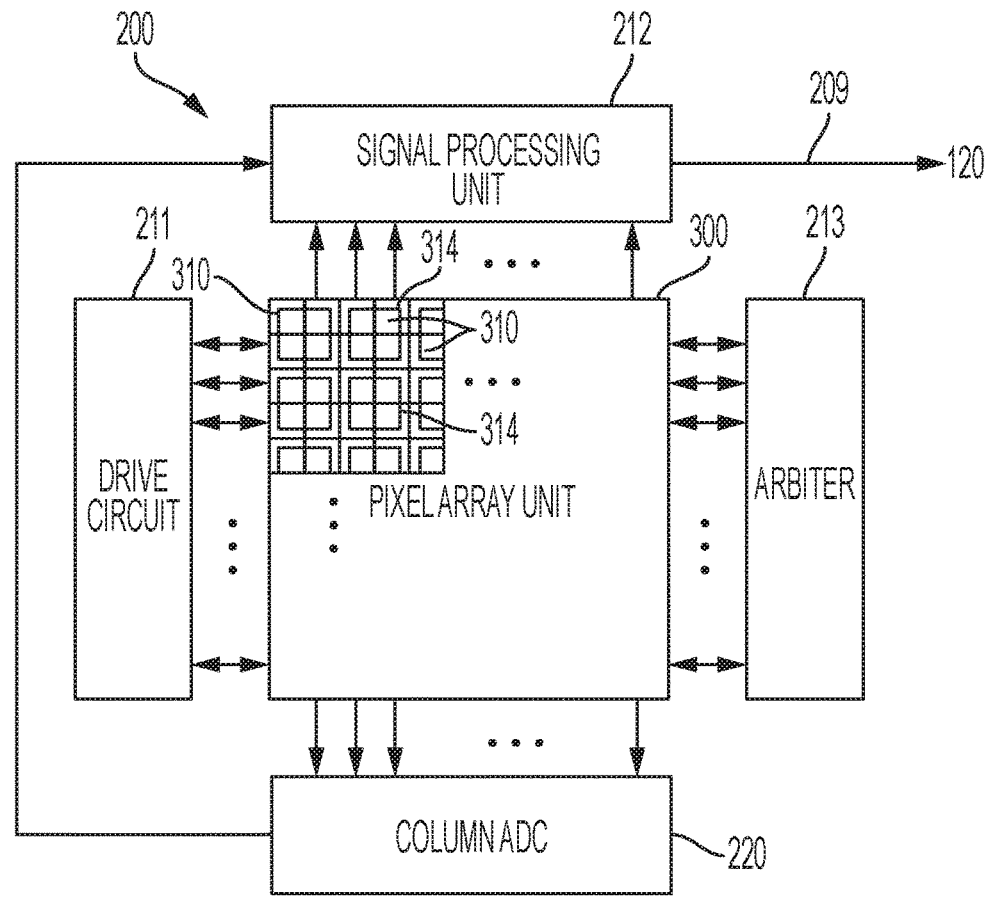
FIG. 3 is a block diagram illustrating a functional configuration example of a solid-state imaging device in accordance with embodiments of the present disclosure.

FIG. 3 is a block diagram illustrating a functional configuration example of the solid-state imaging device according to at least some embodiments of the present disclosure. As illustrated in FIG. 3, the solid-state imaging device 200 includes a drive circuit 211, a signal processing unit 212, an arbiter 213, a column ADC 220, and a pixel array 300.

A plurality of unit cells or pixels 310, also referred to herein simply as pixels 310, are arranged in the pixel array 300 in a two-dimensional lattice shape. Details of the unit pixels 310 will be described later. For example, each of the unit pixels 310 includes a photoelectric conversion element such as a photodiode, and a circuit that generates a pixel signal of a voltage value corresponding to the amount of charges generated in the photoelectric conversion element, hereinafter, referred to as a pixel circuit. Moreover, as discussed in greater detail herein, the pixel circuit can include either or both of a first or imaging signal generation circuit and a second or address event detection readout circuit. Each photoelectric conversion elements can be associated with a respective pixel circuit, or multiple photoelectric conversion elements can be associated with a common pixel circuit.

The plurality of unit pixels 310 are arranged in the pixel array 300 in a two-dimensional lattice shape. The plurality of unit pixels 310 may be grouped into a plurality of pixel blocks or groups, each including a predetermined number of unit pixels. Hereinafter, an assembly of unit pixels which are arranged in a horizontal direction is referred to as "row", and an assembly of unit pixels which are arranged in a direction orthogonal to the row is referred to as "column".

Each of the unit pixels 310 generates charges corresponding to an amount of light received at the respective photoelectric conversion element. In addition, at least some of the unit pixels 310 can be operated to detect the existence or nonexistence of address event ignition on the basis of whether or not a value of a current (hereinafter, referred to as a photocurrent) produced by charges generated in the photoelectric conversion element or a variation amount thereof exceeds a predetermined threshold value. In addition, when the address event is ignited, a request for reading out a pixel signal of a voltage value corresponding to the light-reception amount of the photoelectric conversion element is output to the arbiter 213.

The drive circuit 211 drives each of the unit pixels 310, and allows each of the unit pixels 310 to output a pixel signal to the column ADC 220.

The arbiter 213 arbitrates requests from the unit pixels 310, and transmits a predetermined response to the unit pixel 310 which issues the request on the basis of the arbitration result. The unit pixel 310 which receives the response supplies a detection signal indicating the existence or non-existence of the address event ignition (hereinafter, simply referred to as "address event detection signal") to the drive circuit 211 and the signal processing unit 212.

For every unit pixel 310 column, the column ADC 220 converts an analog pixel signal from the column into a digital signal. In addition, the column ADC 220 supplies a digital signal generated through the conversion to the signal processing unit 212.

The signal processing unit 212 executes predetermined signal processing such as correlated double sampling (CDS) processing (noise removal) and white balance adjustment with respect to the digital signal transmitted from the column ADC 220. In addition, the signal processing unit 212 supplies a signal processing result and an address event detection signal to the recording unit 120 through the signal line 209.

The unit pixels 310 within the pixel array unit 300 may be disposed in pixel groups 314. In the configuration illustrated in FIG. 3, for example, the pixel array unit 300 is constituted by pixel groups 314 that include an assembly of unit pixels 310 that receive wavelength components necessary to reconstruct a color. For example, in the case of reconstructing a color on the basis of three primary colors of RGB, in the pixel array unit 300, a unit pixel 310 that receives light of a red (R) color, a unit pixel 310 that receives light of a green (G) color, and a unit pixel 310 that receives light of a blue (B) color are arranged in groups 314a according to a predetermined color filter array.

Examples of the color filter array configurations include various arrays or pixel groups such as a Bayer array of 2×2 pixels, a color filter array of 3×3 pixels which is employed in an X-Trans (registered trademark) CMOS sensor (hereinafter, also referred to as "X-Trans (registered trademark) type array"), a Quad Bayer array of 4×4 pixels (also referred to as "Quadra array"), and a color filter of 4×4 pixels in which a white RGB color filter is combined to the Bayer array (hereinafter, also referred to as "white RGB array"). In addition, and as discussed in greater detail elsewhere herein, event detection pixels can be interspersed or included within the pixel array 300. Is also discussed in greater detail elsewhere herein, the event detection pixels may be provided as a dedicated event detection pixels, which only perform an event detection function, or as combined event detection and image sensing pixels, which perform both event detection and image sensor functions.

Figure 4:
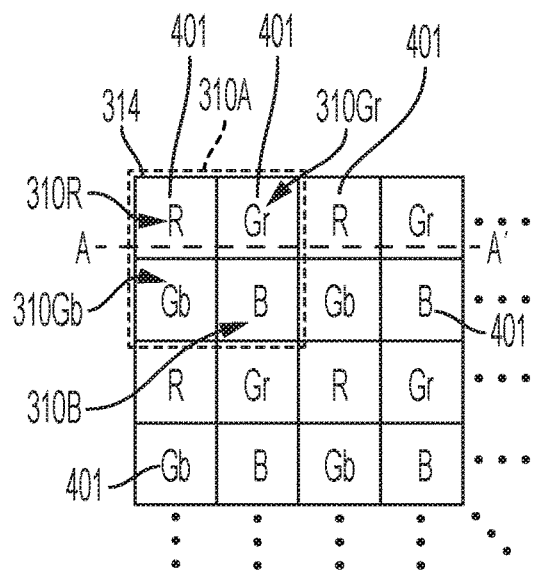
FIG. 4 is a schematic view illustrating an array example of unit pixels in accordance with embodiments of the present disclosure in a case of employing a Bayer array in a color filter array.

FIG. 4 is a schematic view illustrating an array example of unit pixels 310 in the case of employing pixel groups 314 with an arrangement of unit pixels 310 and associated color filters in the color filter array configured to form a plurality of Bayer arrays 310A. As illustrated in FIG. 4, in the case of employing the Bayer array as the color filter array configuration, in the pixel array 300, a basic pattern 310A including a total of four unit pixels 310 of 2×2 pixels is repetitively arranged in a column direction and a row direction. For example, the basic pattern 310A is constituted by a unit pixel 310R including a color filter 401 of a red (R) color, a unit pixel 310Gr including a color filter 401 of a green (Gr) color, a unit pixel 310Gb including a color filter 401 of a green (Gb) color, and a unit pixel 310B including a color filter 401 of a blue (B) color.

Figure 5A:
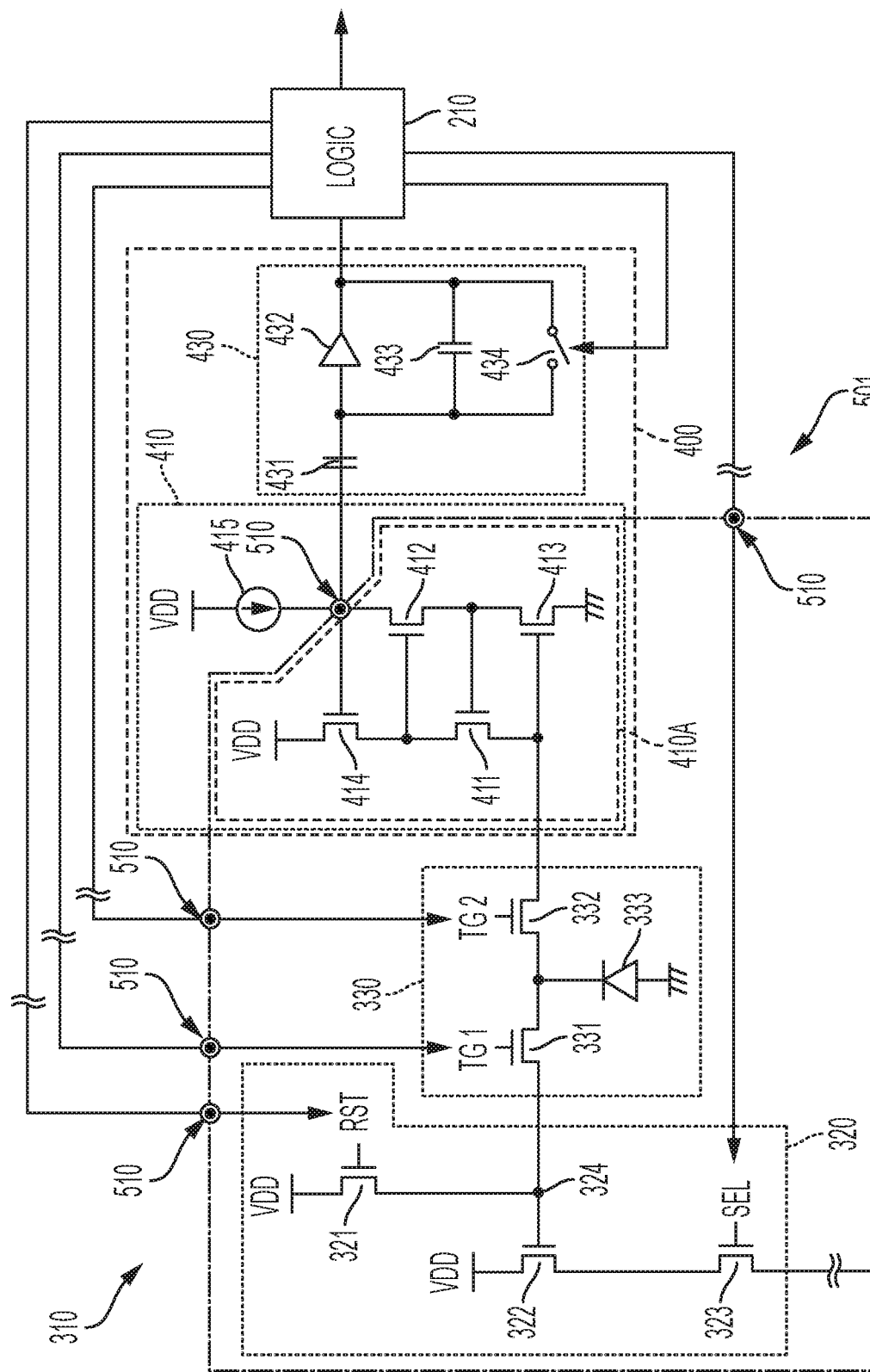
FIG. 5A is a circuit diagram illustrating a schematic configuration example of a unit pixel with combined event detection and image sensor functions in accordance with embodiments of the present disclosure.

Next, a configuration example of a unit pixel 310 will be described. FIG. 5A is a circuit diagram illustrating a schematic configuration example of the unit pixel 310 according to at least some embodiments of the present disclosure, and in particular in accordance with embodiments that include pixels 310 configured as combined or shared event detection (DVS) and image sensor (IS) pixels 501 that perform both event detection and image sensor functions. As illustrated in FIG. 5A, the unit pixel 310 includes, for example, a pixel imaging signal generation unit (or readout circuit) 320, a light-receiving unit 330, and an address event detection unit (or readout circuit) 400. According to at least one example embodiment, the readout circuit 400 is configured to control the readout circuit 320 based on charge generated by a photoelectric conversion element (or photoelectric conversion region) 333. Furthermore, the logic circuit 210 in FIG. 5A is a logic circuit including, for example, the drive circuit 211, the signal processing unit 212, and the arbiter 213 in FIG. 3.

For example, the light-receiving unit 330 includes a first or imaging transmission transistor or gate (first transistor) 331, a second or address event detection transmission transistor or gate (second transistor) 332, and a photoelectric conversion element 333. A first transmission signal TG1 transmitted from the drive circuit 211 is selectively supplied to a gate of the first transmission transistor 331 of the light-receiving unit 330, and a second transmission signal TG2 transmitted from the drive circuit 211 is selectively supplied to a gate of the second transmission transistor 332. An output through the first transmission transistor 331 of the light-receiving unit 330 is connected to the pixel imaging signal generation unit 320, and an output through the second transmission transistor 332 is connected to the address event detection unit 400.

For example, the pixel imaging signal generation unit 320 includes a reset transistor (third transistor) 321, an amplification transistor (fourth transistor) 322, a selection transistor (fifth transistor) 323, and a floating diffusion layer (FD) 324.

In accordance with at least some embodiments of the present disclosure, the first transmission transistor 331 and the second transmission transistor 332 of the light-receiving unit 330 are constituted, for example, by using an N-type metal-oxide-semiconductor (MOS) transistor (hereinafter, simply referred to as "NMOS transistor"). Similarly, the reset transistor 321, the amplification transistor 322, and the selection transistor 323 of the pixel imaging signal generation unit 320 are each constituted, for example, by using the NMOS transistor.

For example, the address event detection unit 400 includes a current-voltage conversion unit 410 and a subtractor 430. However, the address event detection unit 400 is further provided with a buffer, a quantizer, and a transmission unit. Details of the address event detection unit 400 will be described in the following description by using FIG. 6 and the like.

In the illustrated configuration, the photoelectric conversion element 333 of the light-receiving unit 330 photoelectrically converts incident light to generate a charge. The first transmission transistor 331 transmits a charge generated in the photoelectric conversion element 333 to the floating diffusion layer 324 in accordance with the first transmission signal TG1. The second transmission transistor 332 supplies an electric signal (photocurrent) based on the charge generated in the photoelectric conversion element 333 to the address event detection unit 400 in accordance with the control signal TG2.

When an instruction for image sensing is given by the control unit 130, the drive circuit 211 in the logic circuit 210 outputs the control signal for setting the first transmission transistor 331 of the light-receiving unit 330 in the pixel array 300 to an ON-state. With this arrangement, a photocurrent generated in the photoelectric conversion element 333 of the light-receiving unit 330 is supplied to the pixel imaging signal generation readout circuit 320 through the first transmission transistor 331. More particularly, the floating diffusion layer 324 accumulates charges transmitted from the photoelectric conversion element 333 through the first transmission transistor 331. The reset transistor 321 discharges (initializes) the charges accumulated in the floating diffusion layer 324 in accordance with a reset signal transmitted from the drive circuit 211. The amplification transistor 322 allows a pixel signal of a voltage value corresponding to an amount of charge accumulated in the floating diffusion layer 324 to appear in a vertical signal line VSL. The selection transistor 323 switches a connection between the amplification transistor 322 and the vertical signal line VSL in accordance with a selection signal SEL transmitted from the drive circuit 211. Furthermore, the analog pixel signal that appears in the vertical signal line VSL is read out by the column ADC 220, and is converted into a digital pixel signal.

When an instruction for address event detection initiation is given by the control unit 130, the drive circuit 211 in the logic circuit 210 outputs the control signal for setting the second transmission transistor 332 of the light-receiving unit 330 in the pixel array unit 300 to an ON-state. With this arrangement, a photocurrent generated in the photoelectric conversion element 333 of the light-receiving unit 330 is supplied to the address event detection unit 400 of each unit pixel 310 through the second transmission transistor 332.

When detecting address event ignition on the basis of the photocurrent from the light-receiving unit 330, the address event detection unit 400 of each unit pixel 310 outputs a request to the arbiter 213. With respect to this, the arbiter 213 arbitrates the request transmitted from each of the unit pixels 310, and transmits a predetermined response to the unit pixel 310 that issues the request on the basis of the arbitration result. The unit pixel 310 that receives the response supplies a detection signal indicating the existence or nonexistence of the address event ignition (hereinafter, referred to as "address event detection signal") to the drive circuit 211 and the signal processing unit 212 in the logic circuit 210.

The drive circuit 211 sets the second transmission transistor 332 in the unit pixel 310 that is a supply source of the address event detection signal to an OFF-state. With this arrangement, a supply of the photocurrent from the light-receiving unit 330 to the address event detection unit 400 in the unit pixel 310 is stopped.

Next, the drive circuit 211 sets the first transmission transistor 331 in the light-receiving unit 330 of the unit pixel 310 to an ON-state by the transmission signal TG1. With this arrangement, a charge generated in the photoelectric conversion element 333 of the light-receiving unit 330 is transmitted to the floating diffusion layer 324 through the first transmission transistor 331. In addition, a pixel signal of a voltage value corresponding to a charge amount of charges accumulated in the floating diffusion layer 324 appears in the vertical signal line VSL that is connected to the selection transistor 323 of the pixel imaging signal generation unit 320.

As described above, in the solid-state imaging device 200, a pixel signal SIG is output from the unit pixel 310 in which the address event ignition is detected to the column ADC 220. In accordance with further embodiments of the present disclosure, a pixel signal is output from the unit pixels 310 within a group or sub array of unit pixels 310 associated with the address of the unit pixel 310 from which an address event detection signal has been provided.

Furthermore, for example, the light-receiving unit 330, the pixel imaging signal generation unit 320, and two log (LG) transistors (sixth and seventh transistors) 411 and 414 and two amplification transistors (eighth and ninth transistors) 412 and 413 in the current-voltage conversion unit 410 of the address event detection unit 400 are disposed, for example, in the light-receiving chip 201 illustrated in FIG. 2, and other components can be disposed, for example, in the logic chip 202 that is joined to the light-receiving chip 201 through the Cu—Cu joining. Therefore, in the following description, in the unit pixel 310, configurations which are disposed in the light-receiving chip 201 are referred to as "upper layer circuit".

Figure 5B:
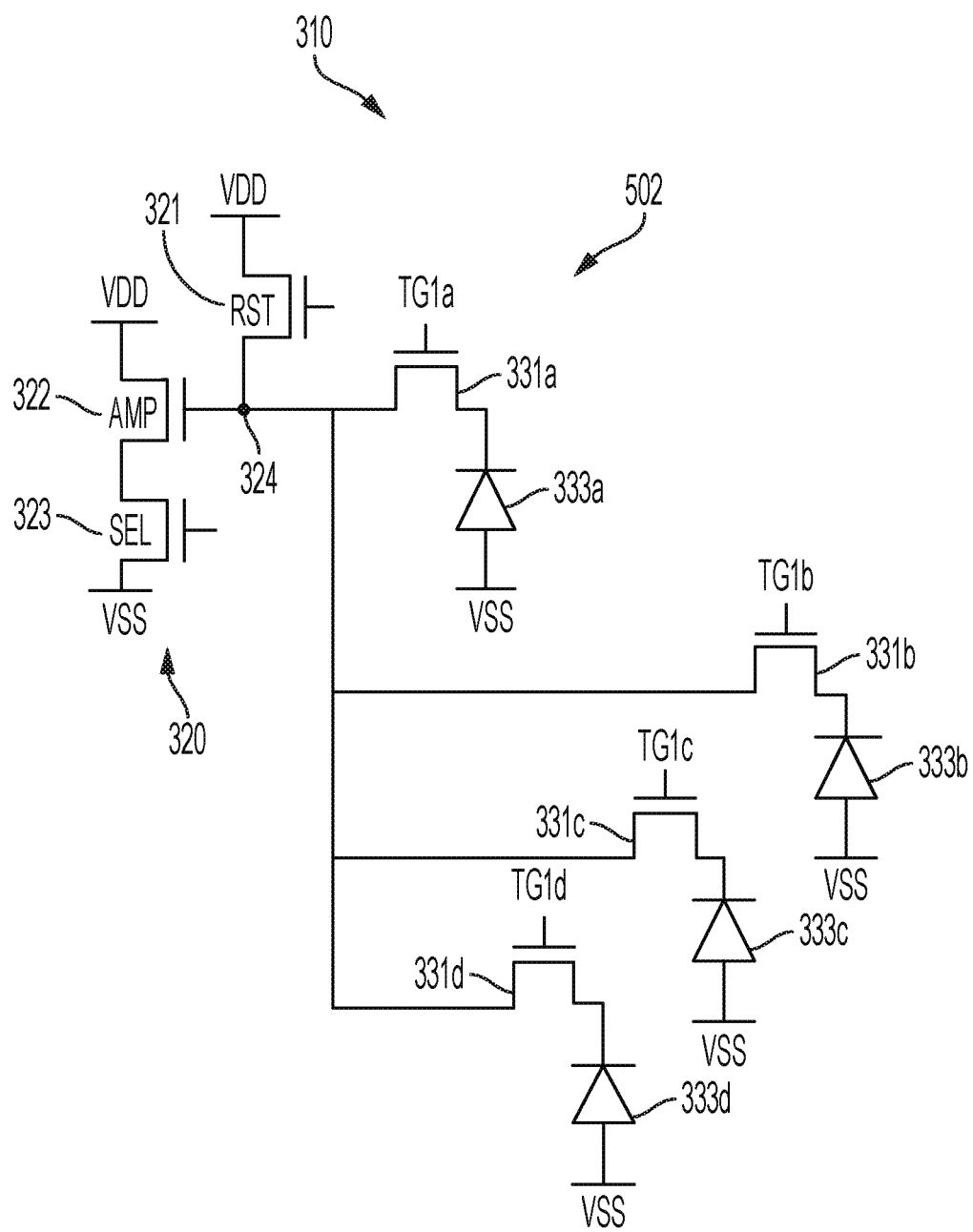
FIG. 5B is a circuit diagram illustrating a schematic configuration example of a group of image sensing pixels in accordance with embodiments of the present disclosure.

A configuration example of a group of unit pixels 310 configured as image sensing pixels 502 with a shared pixel imaging signal generation readout circuitry 320 in accordance with at least some embodiments of the present disclosure is depicted in FIG. 5B. In this example, each photoelectric conversion element 333 is selectively connected to the floating diffusion 324 via a respective transfer gate 331. In addition, the components of the pixel imaging signal readout circuit 320 are shared by the photoelectric conversion units 333. In this example, three photoelectric conversion units 333a-333d, and three corresponding transfer gates 331a-331d, are shown. However, any number of photoelectric conversion units 333 and respective transfer gates 331 can be included in connection with a shared pixel imaging signal readout circuit 320.

Figure 5C:
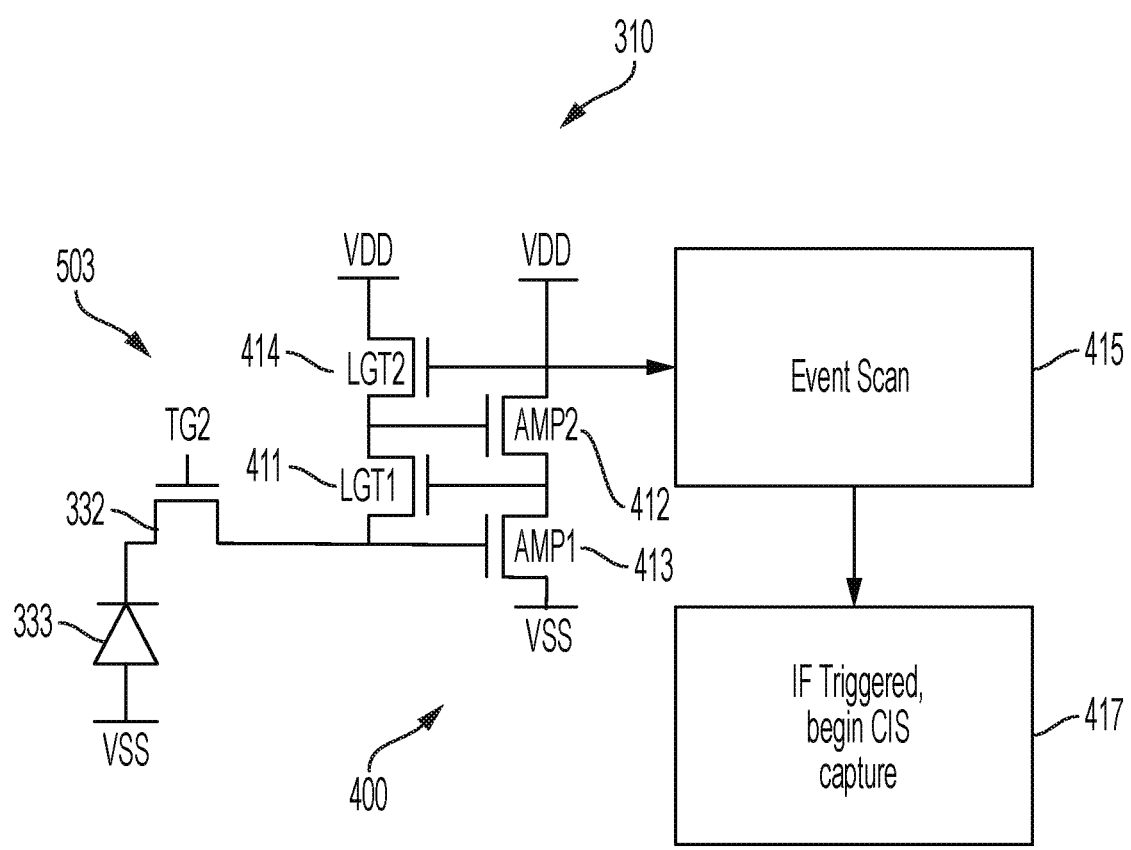
FIG. 5C is a circuit diagram illustrating a schematic configuration example of an event detection pixel in accordance with embodiments of the present disclosure.

A configuration example of a unit pixel 310 configured as a single function address event detection pixel 503 and associated address event detection readout circuit 400 elements is depicted in FIG. 5C. As shown, this example includes a single photoelectric conversion element 333 selectively connected by a transfer gate 332 to components of an address event detection readout circuit 400 that is not associated with any other photoelectric conversion element 333. An event scan control block 415 controls operation of the address event detection readout circuit 400. In response to the detection of an event by the address event detection readout circuit 400 while the circuit 400 is active, image sensor capture for an associated image sensing pixel or group of pixels 310 is initiated 417.

Figure 6:
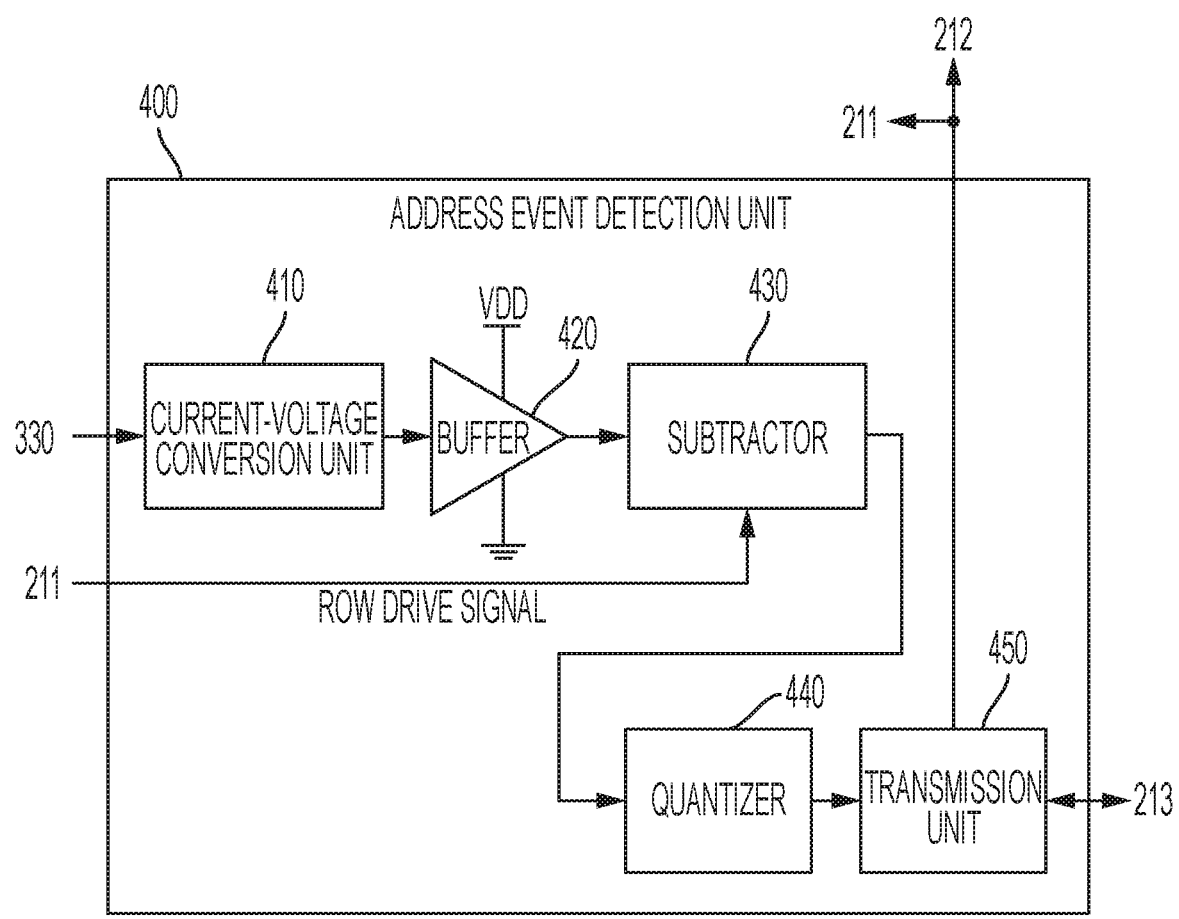
FIG. 6 is a block diagram illustrating a schematic configuration example of an address event detection unit in accordance with embodiments of the present disclosure.

FIG. 6 is a block diagram illustrating a schematic configuration example of the address event detection unit 400 according to at least some embodiments of the present disclosure. As illustrated in FIG. 6, the address event detection unit 400 includes a current-voltage conversion unit 410, a buffer 420, a subtractor 430, a quantizer 440, and a transmission unit 450.

The current-voltage conversion unit 410 converts the photocurrent from the light-receiving unit 330 into a voltage signal in a logarithm thereof, and supplies the voltage signal generated through the conversion to the buffer 420.

The buffer 420 corrects the voltage signal transmitted from the current-voltage conversion unit 410, and outputs a voltage signal after correction to the subtractor 430.

The subtractor 430 lowers a voltage level of the voltage signal transmitted from the buffer 420 in accordance with a row drive signal transmitted from the drive circuit 211 and, supplies the lowered voltage signal to the quantizer 440.

The quantizer 440 quantizes the voltage signal transmitted from the subtractor 430 into a digital signal, and outputs the digital signal generated through the quantization to the transmission unit 450 as a detection signal.

The transmission unit 450 transmits the detection signal transmitted from the quantizer 440 to the signal processing unit 212 and the like. For example, when address event ignition is detected, the transmission unit 450 supplies a request for transmission of an address event detection signal from the transmission unit 450 to the drive circuit 211 and the signal processing unit 212 to the arbiter 213. In addition, when receiving a response with respect to the request from the arbiter 213, the transmission unit 450 supplies the detection signal to the drive circuit 211 and the signal processing unit 212.

For example, the current-voltage conversion unit 410 in the configuration illustrated in FIG. 6 can include the two LG transistors 411 and 414, the two amplification transistors 412 and 413, and a constant-current circuit 415 as illustrated in FIG. 5A.

For example, a source of the LG transistor 411 and a gate of the amplification transistor 413 are connected to a drain of the second transmission transistor 332 of the light-receiving unit 330. In addition, for example, a drain of the LG transistor 411 is connected to a source of the LG transistor 414 and a gate of the amplification transistor 412. For example, a drain of the LG transistor 414 is connected to a power supply terminal VDD.

In addition, for example, a source of the amplification transistor 413 is grounded, and a drain thereof is connected to a gate of the LG transistor 411 and a source of the amplification transistor 412. For example, a drain of the amplification transistor 412 is connected to a power supply terminal VDD through the constant-current circuit 415. For example, the constant-current circuit 415 is constituted by a load MOS transistor such as a p-type MOS transistor.

In this connection relationship, a loop-shaped source follower circuit is constructed. With this arrangement, a photocurrent from the light-receiving unit 330 is converted into a voltage signal in a logarithmic value corresponding to a charge amount thereof. Furthermore, the LG transistors 411 and 414, and the amplification transistors 412 and 413 may be each constituted, for example, by an NMOS transistor.

Figure 7:
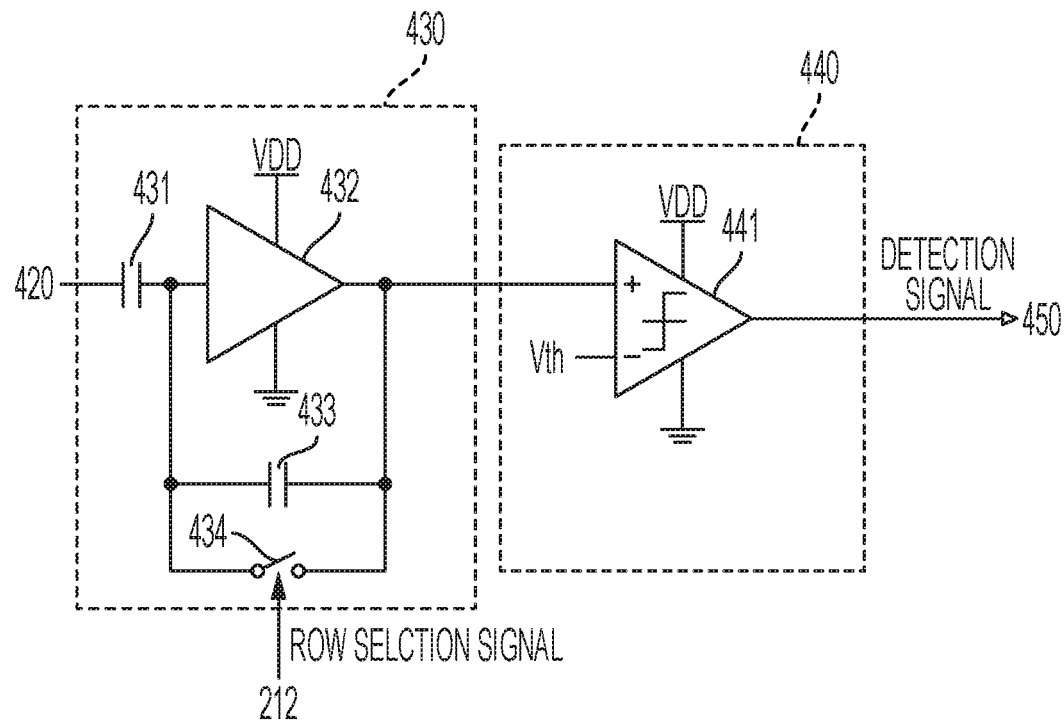
FIG. 7 is a circuit diagram illustrating a schematic configuration example of a subtractor and a quantizer in accordance with embodiments of the present disclosure.

FIG. 7 is a circuit diagram illustrating a schematic configuration example of the subtractor 430 and the quantizer 440 according to at least some embodiments of the present disclosure. As illustrated in FIG. 7, the subtractor 430 includes capacitors 431 and 433, an inverter 432, and a switch 434. In addition, the quantizer 440 includes a comparator 441.

One end of the capacitor 431 is connected to an output terminal of the buffer 420, and the other end is connected to an input terminal of the inverter 432. The capacitor 433 is connected to the inverter 432 in parallel. The switch 434 opens or closes a route connecting both ends of the capacitor 433 in accordance with a row drive signal.

The inverter 432 inverts a voltage signal that is input through the capacitor 431. The inverter 432 outputs an inverted signal to a non-inverting input terminal (+) of the comparator 441.

When the switch 434 is turned on, a voltage signal Vinit is input to a buffer 420 side of the capacitor 431. In addition, the opposite side becomes a virtual ground terminal. A potential of the virtual ground terminal is set to zero for convenience. At this time, when a capacity of the capacitor 431 is set as C1, a potential Qinit that is accumulated in the capacitor 431 is expressed by the following Expression (1). On the other hand, both ends of the capacitor 433 are short-circuited, and thus an accumulated charge thereof becomes zero.

$$Qinit = C1 \times Vinit \quad (1)$$

Next, when considering a case where the switch 434 is turned off, and a voltage of the capacitor 431 on the buffer 420 side varies and reaches Vafter, a charge Qafter accumulated in the capacitor 431 is expressed by the following Expression (2).

$$Qafter = C1 \times Vafter \quad (2)$$

On the other hand, when an output voltage is set as Vout, a charge Q2 accumulated in the capacitor 433 is expressed by the following Expression (3).

$$Q2 = -C2 \times Vout \quad (3)$$

At this time, a total charge amount of the capacitors 431 and 433 does not vary, and thus the following Expression (4) is established.

$$Qinit = Qafter + Q2 \quad (4)$$

When Expression (1) to Expression (3) are substituted for Expression (4), the following Expression (5) is obtained.

$$Vout = -(C1/C2) \times (Vafter - Vinit) \quad (5)$$

Expression (5) represents a subtraction operation of a voltage signal, and a gain of the subtraction result becomes C1/C2. Typically, it is desired to maximize (or alternatively, improve) the gain, and thus it is preferable to make a design so that C1 becomes large and C2 becomes small. On the other hand, when C2 is excessively small, kTC noise increases, and thus there is a concern that noise characteristics deteriorate. Accordingly, a reduction in the capacity of C2 is limited to a range capable of permitting noise. In addition, since the address event detection unit 400 including the subtractor 430 is mounted for every unit pixel 310, a restriction on an area is present in capacities C1 and C2. Values of the capacities C1 and C2 are determined in consideration of the restriction.

The comparator 441 compares a voltage signal transmitted from the subtractor 430 and a predetermined threshold voltage Vth that is applied to an inverting input terminal (−). The comparator 441 outputs a signal indicating the comparison result to the transmission unit 450 as a detection signal.

In addition, when a conversion gain by the current-voltage conversion unit 410 is set as $CG_{log}$, and a gain of the buffer 420 is set to "1", a gain A of the entirety of the address event detection unit 400 is expressed by the following Expression (6).

[Mathematical Formula 1]

$$A = \frac{CG_{log} \cdot C1}{C2} \sum_{n=1}^{N} i_{photo\_n} \qquad (6)$$

In Expression (6), $i_{photo\_n}$ represents a photocurrent of an nth unit pixel 310, and a unit thereof is, for example, an ampere (A). N represents the number of the unit pixels 310 in a pixel block, and is "1" in this embodiment.

Figure 8:
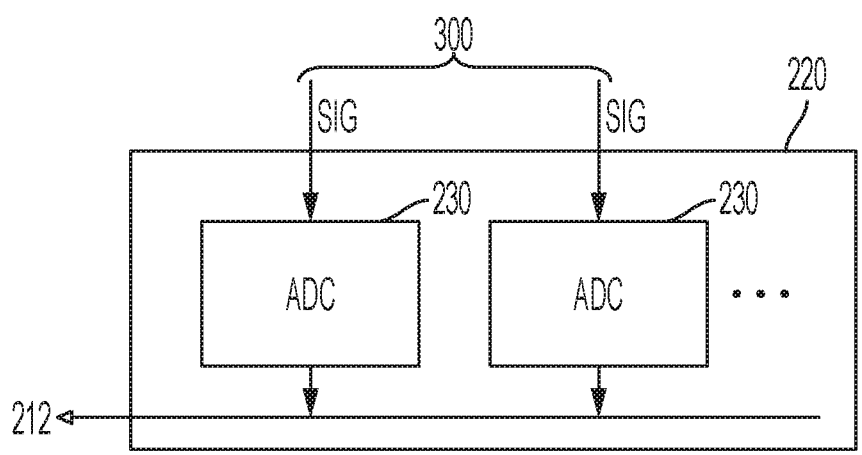
FIG. 8 is a block diagram illustrating a schematic configuration example of a column ADC in accordance with embodiments of the present disclosure.

FIG. 8 is a block diagram illustrating a schematic configuration example of the column ADC according to at least some embodiments of the present disclosure. The column ADC 220 includes a plurality of ADCs 230 which are provided for every column of the unit pixels 310.

Each of the ADCs 230 converts an analog pixel signal that appears in the vertical signal line VSL into a digital signal. For example, the pixel signal is converted into a digital signal in which a bit length is greater than that of a detection signal. For example, when the detection signal is set to two bits, the pixel signal is converted into a digital signal of three or greater bits (16 bits and the like). The ADC 230 supplies a generated digital signal to the signal processing unit 212.

Next, an operation of the solid-state imaging device 200 according to at least embodiments of the present disclosure will be described in detail with reference to the accompanying drawings.

Figure 9A:
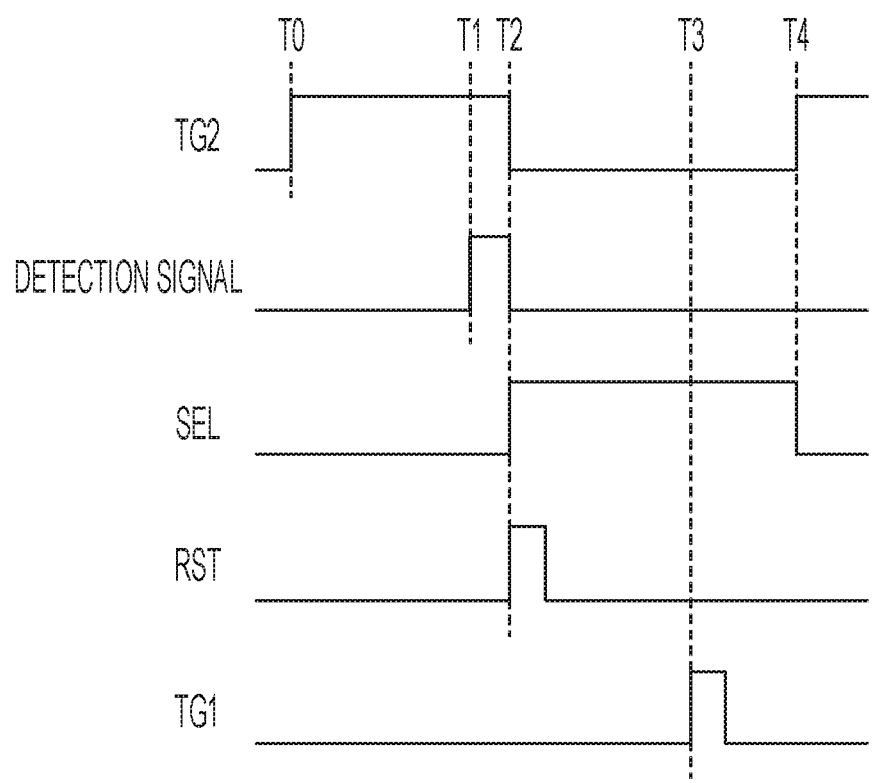
FIG. 9A is a timing chart illustrating an example of an operation of a solid-state imaging device in accordance with embodiments of the present disclosure.

First, an example of the operation of the solid-state imaging device 200 will be described by using a timing chart. FIG. 9A is a timing chart illustrating an example of the operation of the solid-state imaging device according to an embodiment of the present disclosure.

As illustrated in FIG. 9A, at a timing T0, when an instruction for address event detection initiation is given by the control unit 130, the drive circuit 211 raises the control signal TG2 applied to the gate of the second transmission transistor 332 of all of the light-receiving units 330 in the pixel array unit 300 to a high level. With this arrangement, the second transmission transistors 332 of all of the light-receiving units 330 enter an ON-state, and a photocurrent based on a charge generated in the photoelectric conversion element 333 of each of the light-receiving units 330 is supplied from each the light-receiving units 330 to each of a plurality of the address event detection units 400.

In addition, in a period in which the control signal TG2 is at a high level, all of the transmission signals TG1 applied to the gate of the first transmission transistor 331 in each of the light-receiving units 330 are maintained at a low level. Accordingly, in this period, a plurality of the transmission transistors 331 in all of the light-receiving units 330 are in an OFF-state.

Next, a case where the address event detection unit 400 of an arbitrary unit pixel 310 configured to perform event detection detects address event ignition in a period in which the control signal TG2 is in a high level will be assumed. In this case, the address event detection unit 400 that detects the address event ignition transmits a request to the arbiter 213. With respect to this, the arbiter 213 arbitrates the request, and returns a response for the request to the address event detection unit 400 that issues the request.

The address event detection unit 400 that receives the response raises a detection signal that is input to the drive circuit 211 and the signal processing unit 212 to a high level, for example, in a period of a timing T1 to a timing T2. Furthermore, in this description, it is assumed that the detection signal is a one-bit signal The drive circuit 211 to which a high-level detection signal is input from the address event detection unit 400 at the timing T1 lowers all control signals TG2 to a low level at a subsequent timing T2. With this arrangement, supply of a photocurrent from all of the light-receiving units 330 of the pixel array unit 300 to the address event detection unit 400 is stopped.

In addition, at the timing T2, the drive circuit 211 raises a selection signal SEL that is applied to a gate of the selection transistor 323 in the pixel imaging signal generation unit 320 of the unit pixel 310 in which the address event ignition is detected (hereinafter, referred to as "reading-out target unit pixel") to a high level, and raises a reset signal RST that is applied to a gate of the reset transistor 321 of the same pixel imaging signal generation unit 320 to a high level for a constant pulse period, thereby discharging (initializing) charges accumulated in the floating diffusion layer 324 of the pixel imaging signal generation unit 320. In this manner, a voltage, which appears in the vertical signal line VSL in a state in which the floating diffusion layer 324 is initialized, is read out by the ADC 230 connected to the vertical signal line VSL in the column ADC 220 as a reset-level pixel signal (hereinafter, simply referred to as "reset level"), and is converted into a digital signal.

Next, at a timing T3 after reading out the reset level, the drive circuit 211 applies a transmission signal TRG of a constant pulse period to the gate of the first transmission transistor 331 of the light-receiving unit 330 in the reading-out target unit pixel 310. With this arrangement, a charge generated in the photoelectric conversion element 333 of the light-receiving unit 330 is transmitted to the floating diffusion layer 324 in the pixel imaging signal generation unit 320, and a voltage corresponding to charges accumulated in the floating diffusion layer 324 appears in the vertical signal line VSL. In this manner, the voltage that appears in the vertical signal line VSL is read out by the ADC 230 connected to the vertical signal line VSL in the column ADC 220 as a signal-level pixel signal of the light-receiving unit 330 (hereinafter, simply referred to as "signal level") and is converted into a digital value.

The signal processing unit 212 executes CDS processing in which a difference between the reset level and the signal level which are read out as described above is obtained as a net pixel signal corresponding to a light-reception amount of the photoelectric conversion element 333.

Next, at a timing T4, the drive circuit 211 lowers the selection signal SEL that is applied to the gate of the selection transistor 323 in the pixel imaging signal generation readout circuit 320 of the reading-out target unit pixel 310 to a low level, and raises the control signal TG2 that is applied to the gate of the second transmission transistor 332 of all of the light-receiving units 330 in the pixel array unit 300 to a high level. With this arrangement, address event ignition detection in all of the light-receiving units 330 in the pixel array unit 300 is restarted.

Figure 9B:
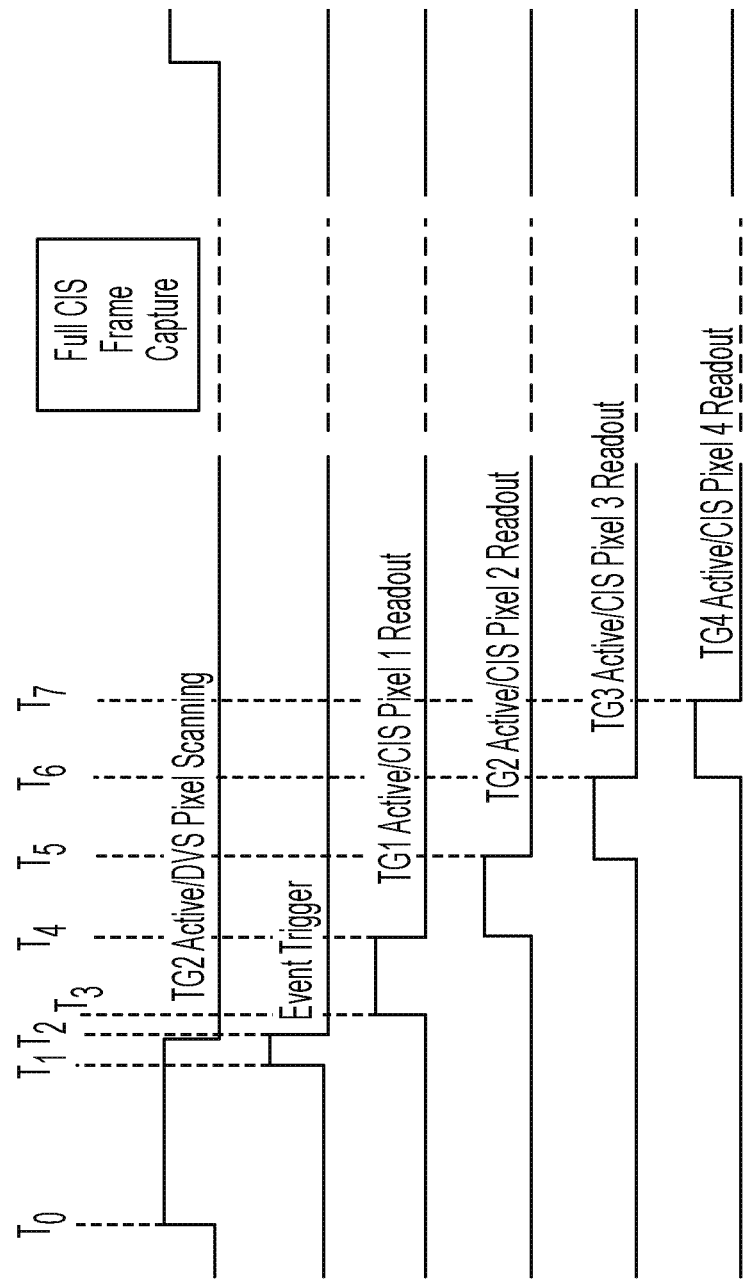
FIG. 9B is a timing chart illustrating an example of an operation of a solid-state imaging device in accordance with other embodiments of the present disclosure.

FIG. 9B is a timing chart illustrating an example of an operation of a solid-state imaging device in accordance with other embodiments of the present disclosure. At a timing T0, when an instruction for address event detection initiation is given by the control unit 130, the drive circuit 211 raises the control signal TG2 applied to the gate of the transmission transistor 332 associated with photoelectric conversion elements 333 of selectively activated address event detection units 400. More particularly, some or all of the address event detection units 400 may be activated.

In addition, the transmission signal TG1 applied to the gates of the first transmission transistors 331 are maintained in a low level. Accordingly, the associated transmission transistors 331 are in an OFF-state.

In this example, an arbitrary address event detection unit 400 detects address event ignition at a time T1 during which the control signal TG2 is at a high level, and the associated transmission transistor 332 is in an ON-state. In response to the event trigger, image frame capture begins. The image frame capture can be a full frame image capture that involves all of the image sensing pixels 502 included in the pixel array 300. Alternatively, an event detection by a particular event detection unit 400 can operate as a trigger for image capture of by a set of image sensing pixels 502 in a vicinity of the event detection unit 400, or otherwise associated with the event detection unit 400. Readout of signals obtained by the image sensing pixels can then be performed.

Figure 10:
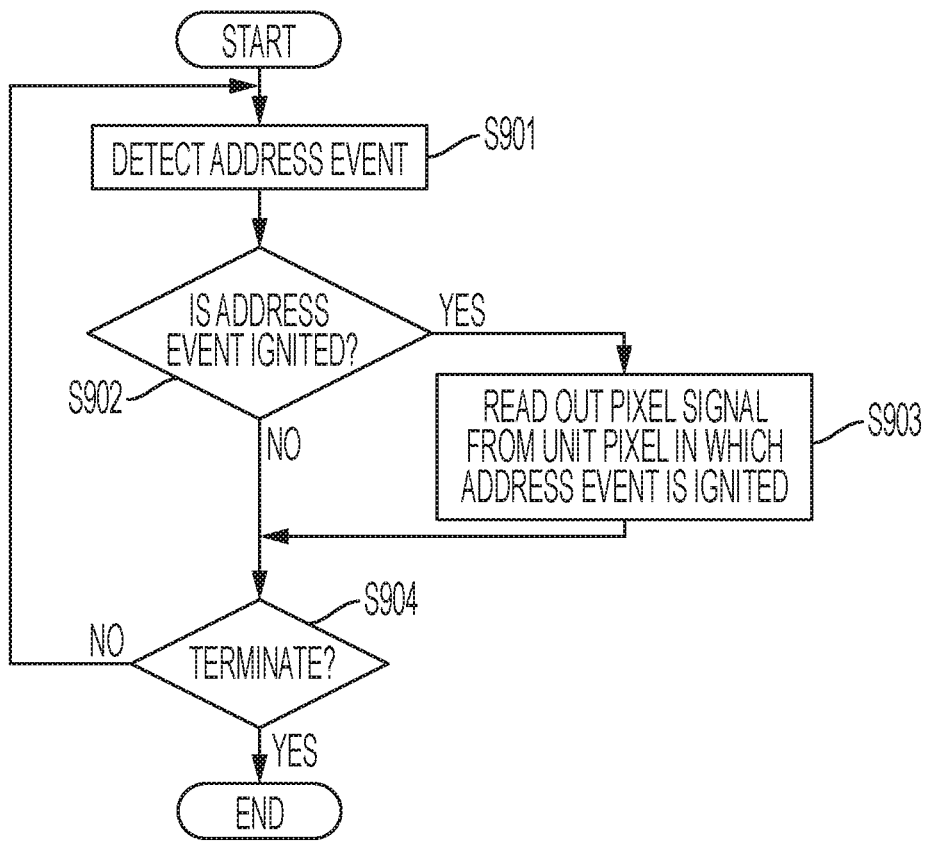
FIG. 10 is a flowchart illustrating an example of the operation of a solid-state imaging device in accordance with embodiments of the present disclosure.

Next, an example of the operation of the solid-state imaging device 200 will be described by using a flowchart. FIG. 10 is a flowchart illustrating an example of the operation of the solid-state imaging device according to at least some embodiments of the present disclosure. For example, this operation is initiated when a predetermined application for detecting an address event is executed.

As illustrated in FIG. 10, in this operation, first, each of the unit pixels 310 in the pixel array unit 300 detects the existence or nonexistence of address event ignition (step S901). In addition, the drive circuit 211 determines whether or not address event ignition is detected in any one of the unit pixels 310 (step S902).

In a case where the address event ignition is not detected (NO in step S902), this operation proceeds to step S904. On the other hand, in a case where the address event ignition is detected (YES in step S902), the drive circuit 211 executes reading-out of a pixel signal with respect to the unit pixel 310 in which the address event ignition is detected (step S903), and proceeds to step S904.

In step S904, it is determined whether or not to terminate this operation. In a case where this operation is not terminated (NO in step S904), this operation returns to step S901, and the subsequent operations are repeated. On the other hand, in a case where this operation is terminated (YES in step S904), this operation is terminated.

Figure 11A:
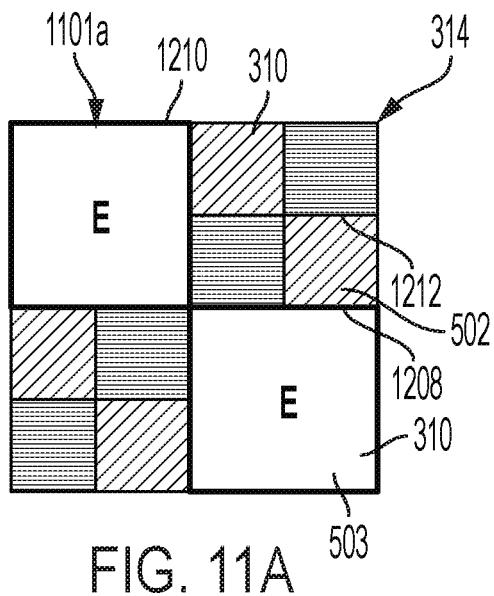
FIG. 11A is a plan view of a portion of a pixel array comprising a group of pixels configured as in a first exemplary embodiment.
Figure 11B:
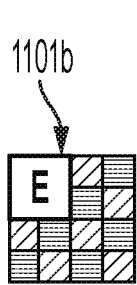
FIG. 11B is a plan view of a portion of another pixel array comprising a group of pixels configured as in the first exemplary embodiment.
Figure 11C:
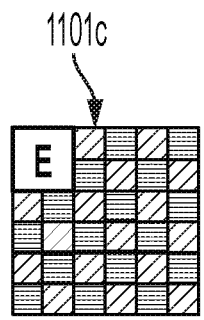
FIG. 11C is a plan view of a portion of another pixel array comprising a group of pixels configured as in the first exemplary embodiment.

FIGS. 11A-11C are plan views of portions of pixel arrays comprising sub-arrays or subsets of pixels 1101 configured as in a first exemplary embodiment. A pixel array 300 can include any number of sub-arrays 1101. More particularly, in this first exemplary embodiment, an area of each image sensing pixel 502 is smaller than an area of each event detection pixel 503. In addition, a ratio of image sensing pixels 502 to event detection pixels 503 differs between the various examples. Specifically, in the example illustrated in FIG. 11A, the ratio of image sensing pixels 502 to event detection pixels 503 within the depicted sub-arrays 1101a is 4:1. This same ratio may apply across the entire pixel array 300. In the example illustrated in FIG. 11B, the ratio of image sensing pixels 502 to event detection pixels 503 is 12:1. In the example illustrated in FIG. 11C, the ratio of image sensing pixels 502 to event detection pixels 503 is 32:1. Other ratios are also possible. In addition, the image sensing pixels 502 can be arranged in groups 314, including but not limited to groups comprising Bayer arrays. One or more separation structures 1210 can be included to provide isolation between adjacent unit pixels 310. For example, but without limitation, RFTI 1208 structures can be formed around each event detection pixel 503. Similarly, RFTI 1208 and/or RDTI 1212 structures can be formed around individual image sensing pixels 502.

Figures 12A, 12B:
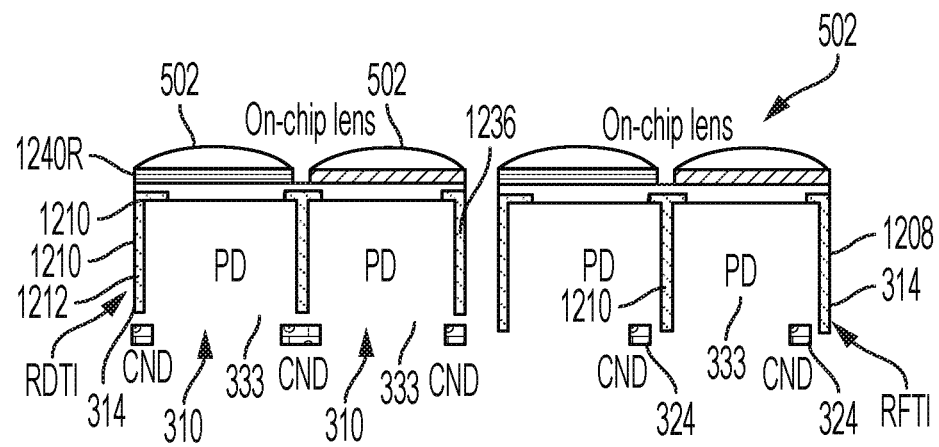
FIG. 12A is a cross-sectional view of a portion of a pixel array comprising a group of pixels configured as in the first exemplary embodiment.
FIG. 12B is a cross-sectional view of a portion of another pixel array comprising a group of pixels configured as in the first exemplary embodiment.

FIG. 12A is a cross-sectional view of a portion of a pixel array 300 comprising a group 314 of image sensing pixels 502 configured as in the first exemplary embodiment. As shown, separation structures 1210 in the form of RDTI structures 1212 can be provided to separate adjacent unit pixels 310. In addition, each image sensing pixel 502 can include an insulation or planarizing layer 1236 formed on a light incident surface of the substrate 1216 in which the photoelectric conversion elements 333 are formed. A color filter 1240 can be provided for each image sensing pixel 502. In this example, a red color filter 1240R is provided as part of a first one of the illustrated image sensing pixels 502, and a green color filter 1240Gr is provided as part of a second one of the illustrated image sensing pixels 502. In addition, one or more floating diffusions 324 may be associated with the group 314 of image sensing pixels 502. In this example, where RDTI isolation structures 1212 are used, one or more of the floating diffusions 324 may be located on or near a second surface of the substrate 1216 and adjacent an end of an RDTI structure 1212.

FIG. 12B is a cross-sectional view of a portion of another pixel array comprising a group 314 of image sensing pixels 502 configured as in the first exemplary embodiment. This example is similar to the previous example, except that RFTI separation structures 1208 is provided between the individual image sensing pixels 502. As a result, the floating diffusions 324 cannot be overlapped with the isolation structures 1210 in a plan view.

Figure 13:
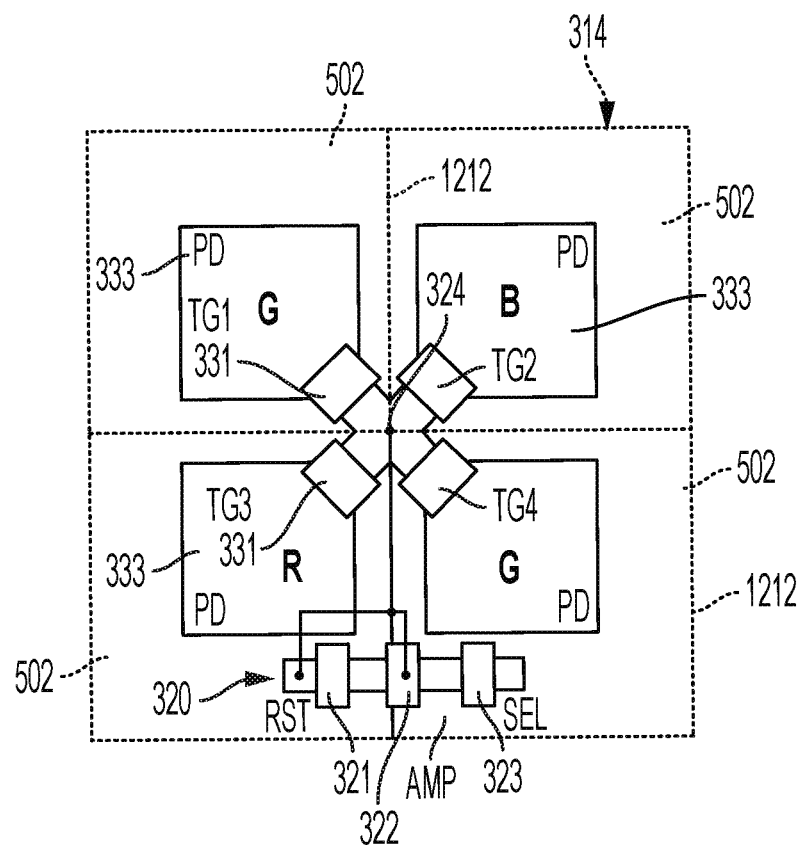
FIG. 13 is a plan view of a configuration of a group of image sensing pixels in accordance with the first exemplary embodiment.

FIG. 13 is a plan view of a configuration of a group 314 of image sensing pixels 502 in accordance with the first exemplary embodiment. In this illustrated example, groups 314 of image sensing pixels 502 are separated from one another by RDTI structures 1212. In addition, individual image sensing pixels 502 are separated from one another by RDTI structures, as also illustrated in the example of FIG. 12A. Each image sensing pixel 502 includes a photoelectric conversion element 333 and an associated transfer gate 331. Moreover, in this example, the image sensing pixels 502 within a group 314 share the pixel imaging signal generation unit or readout circuit 320, or portions thereof. For example, the group of image sensing pixels 502 can have a circuit configuration as depicted in FIG. 5B.

Figure 14:
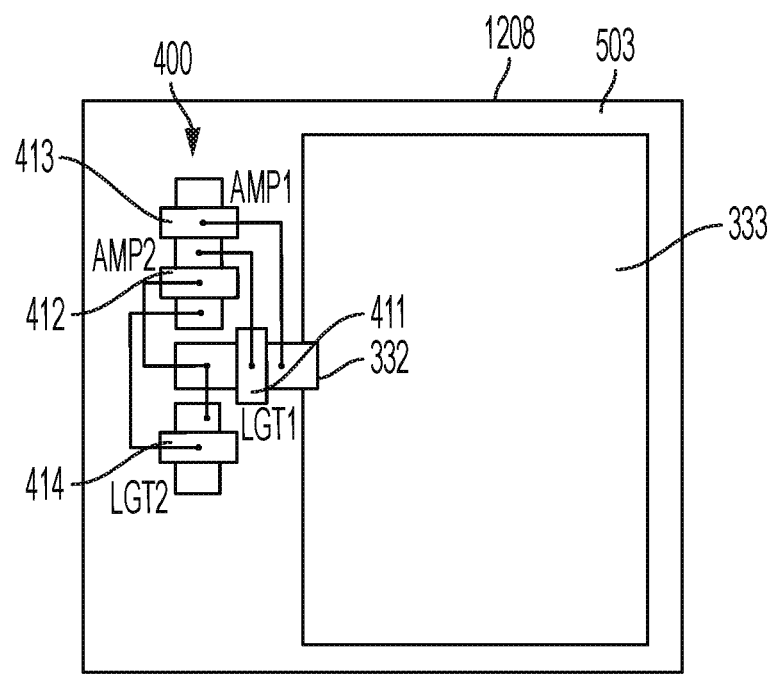
FIG. 14 is a plan view of a configuration of an event detection pixel configured as in the first exemplary embodiment.

FIG. 14 is a plan view of a configuration of an event detection pixel 503 configured as in the first exemplary embodiment. More particularly, each event detection pixel 503 in this embodiment includes a single photoelectric conversion element 333 and address event detection readout circuit 400 components provided for that photoelectric conversion element 333. That is, address event detection readout circuit 400 components are not shared between multiple photoelectric conversion elements 333. In addition, the event detection pixel 503 is isolated from adjacent unit pixels 310 by an RFTI separation structure 1208.

Figure 15:
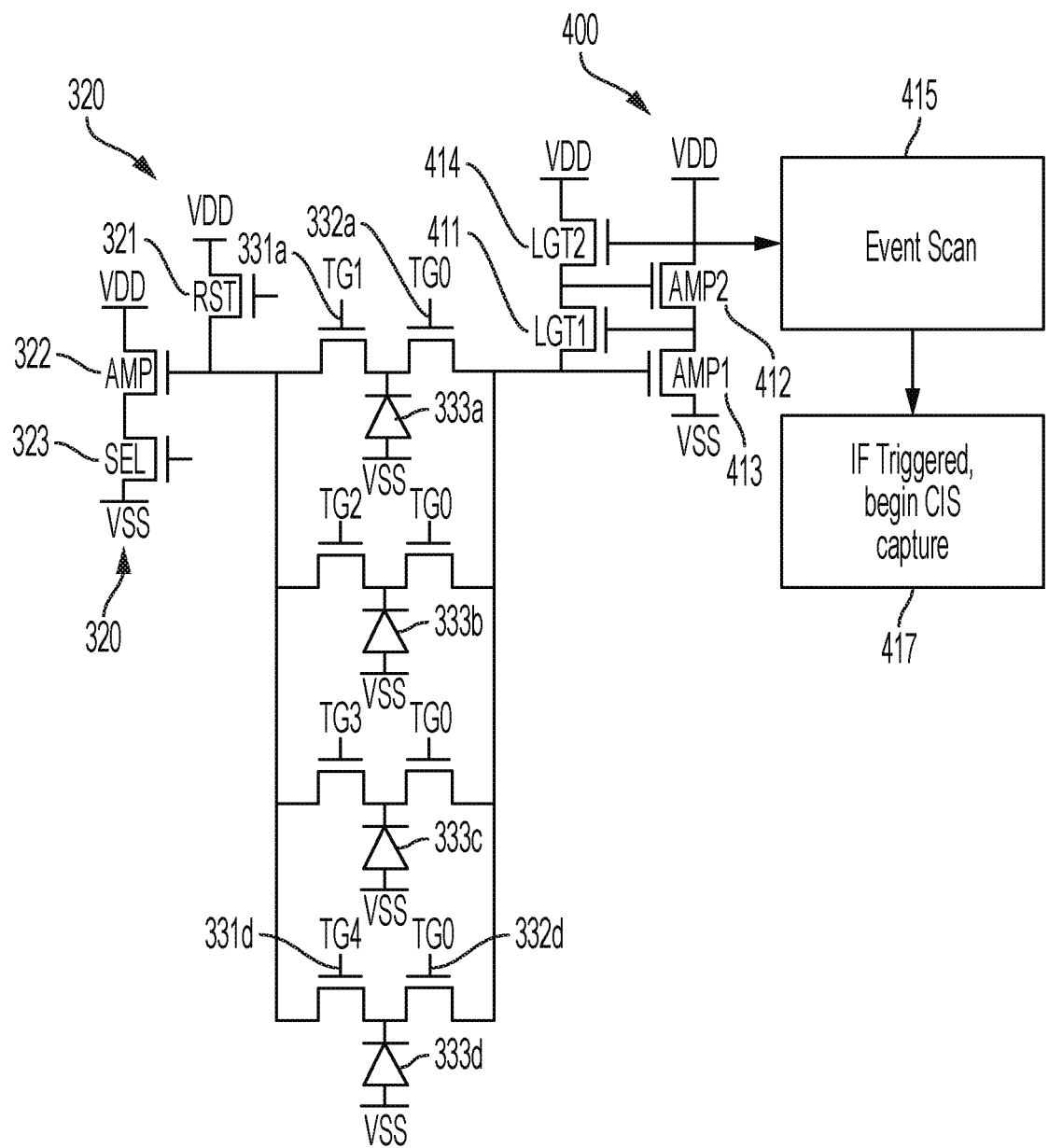
FIG. 15 is a circuit diagram illustrating a schematic configuration example of a group of combined event detection and image sensing pixels in accordance with other embodiments of the present disclosure.

FIG. 15 is a circuit diagram illustrating a schematic configuration example of a group of combined event detection and image sensing pixels 501 with shared circuit elements in accordance with other embodiments of the present disclosure. In such embodiments, each photoelectric conversion element 333 is associated with a first transfer transistor 331 and a second transfer transistor 332. More particularly, the first transfer transistor 331 selectively connects an associated photoelectric conversion element 333 to shared pixel imaging signal generation readout circuit 320 elements, and the second transfer transistor 332 selectively connects and associated photoelectric conversion element 333 to shared address event detection readout circuit 400 components. In accordance with at least some embodiments of the present disclosure, the second transfer transistors 332 associated with multiple photoelectric conversion units 333 within a group 314 of combined event detection and image sensing pixels 501 can be placed in an ON-state simultaneously. In this example, four photoelectric conversion elements 333a-333d share the associated pixel imaging signal generation readout circuit 320 and the address event detection readout circuit 400. However, any number of unit pixels 310 and associated photoelectric conversion elements 333 can share associated circuitry 320 and 400.

Figure 16A:
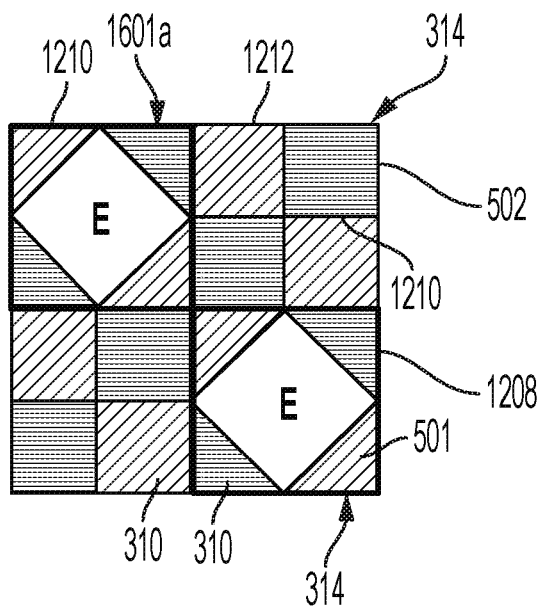
FIG. 16A is a plan view of a portion of a pixel array comprising a group of pixels configured as in a second exemplary embodiment.
Figure 16B:
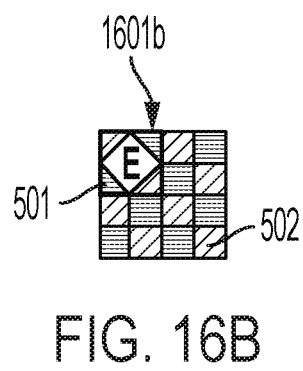
FIG. 16B is a plan view of a portion of another pixel array comprising a group of pixels configured as in the second exemplary embodiment.
Figure 16C:
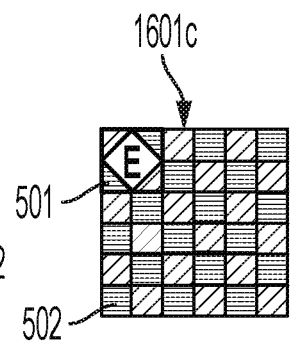
FIG. 16C is a plan view of a portion of another pixel array comprising a group of pixels configured as in the second exemplary embodiment.

FIGS. 16A-16C are plan views of portions of pixel arrays, and in particular sub-arrays or subsets of pixels 1601 configured as in a second exemplary embodiment. More particularly, in this second exemplary embodiment, groups of combined event detection and image sensing pixels 501 are interspersed in the pixel array 300 with groups of image sensing pixels 502. In this example, each group 314 of image sensing pixels 502 includes four image sensing pixels 502, while each group 314 of combined event detection and image sensing pixels 501 includes four combined event detection and image sensing pixels 501. The image sensing pixels 502 may be associated with a readout circuit in which each image sensing pixel 502 within a group 314 of image sensing pixels shares readout circuit 320 elements, as depicted in FIG. 5B. The combined event detection and image sensing pixels 501 may be associated with shared pixel imaging signal generation readout circuit 320 and shared address event detection readout circuit 400 components as depicted in FIG. 15. In addition, the ratio of groups 314 of image sensing pixels 502 to groups 314 of combined event detection and image sensing pixels 501 can vary. For instance, in the example sub-array 1601a illustrated in FIG. 16A, the ratio of image sensing pixels 502 to combined event detection and image sensing pixels 501 is 1:1. In the example sub-array 1601b illustrated in FIG. 16B, the ratio of image sensing pixels 502 to combined event detection and image sensing pixels 501 is 3:1. In the example subarray 1601c illustrated in FIG. 16C, the ratio of image sensing pixels 502 to combined event detection and image sensing pixels 501 is 8:1. In addition, other ratios are possible. In at least some embodiments, color filters may be associated with unit pixels 310 within the groups, for example to form Bayer arrays. Isolation between adjacent unit pixels 310 and be provided by RFTI 1208 and/or RDTI 1212 operation structures 1210. For instance, RDTI 1212 separation structures may be formed around groups of combined event detection and image sensing pixels 501, while RFTI 1208 separation structures may be formed around individual unit pixels 310.

Figure 17A:
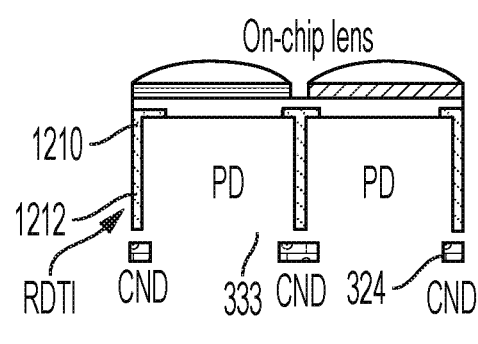
FIG. 17A is a cross sectional view of a portion of a pixel array in accordance with the second exemplary embodiment of the present disclosure.
Figure 17B:
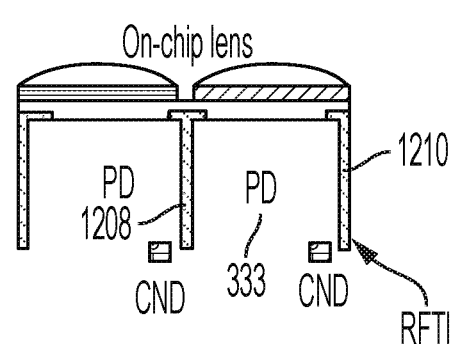
FIG. 17B is a cross sectional view of a portion of another pixel array in accordance with the second exemplary embodiment of the present disclosure.

FIG. 17A is a cross sectional view of a portion of a pixel array in accordance with the second exemplary embodiment of the present disclosure. As shown in this example, separation structures 1210 in the form of RDTI structures 1212 can be provided to separate adjacent unit pixels 310. Where RDTI separation structures 1212 are used, circuit elements or portions of circuit elements, such as a floating diffusion 324 or an amplification transistor 322 or 412, or the like, can be formed adjacent an end of the RDTI structure 1212. FIG. 17B is a cross sectional view of a portion of another pixel array in accordance with the second exemplary embodiment of the present disclosure. In this additional example, separation structures 1210 in the form of RFTI separation structures 1208 be provided to separate adjacent unit pixels 310.

Figure 18:
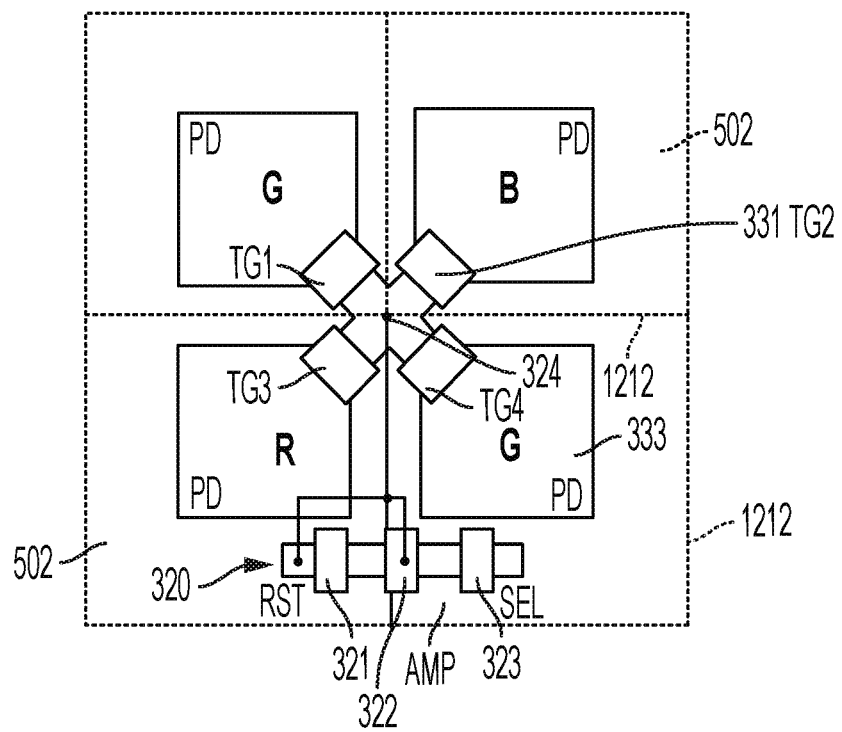
FIG. 18 is a plan view of a configuration of a group of image sensing pixels in accordance with the second exemplary embodiment.

FIG. 18 is a plan view of a configuration of a group of image sensing pixels 502 in accordance with the second exemplary embodiment. In this example, groups 314 of image sensing pixels 502 are separated from one another by RDTI structures 1212. In addition, individual image sensing pixels 502 are separated from one another by RDTI structures, as also illustrated in the example of FIG. 17A. Each image sensing pixel 502 includes a photoelectric conversion element 333 and an associated transfer gate 331. Moreover, in this example, the image sensing pixels 502 within a group 314 share the pixel imaging signal generation unit or readout circuit 320, or portions thereof. For example, the group of image sensing pixels 502 can have a circuit configuration as depicted in FIG. 5B. Where RDTI separation structures 1212 are used, circuit elements or portions of circuit elements, such as a floating diffusion 324 or an amplification transistor 322, or the like, can be formed adjacent an end of the RDTI structure 1212.

Figure 19:
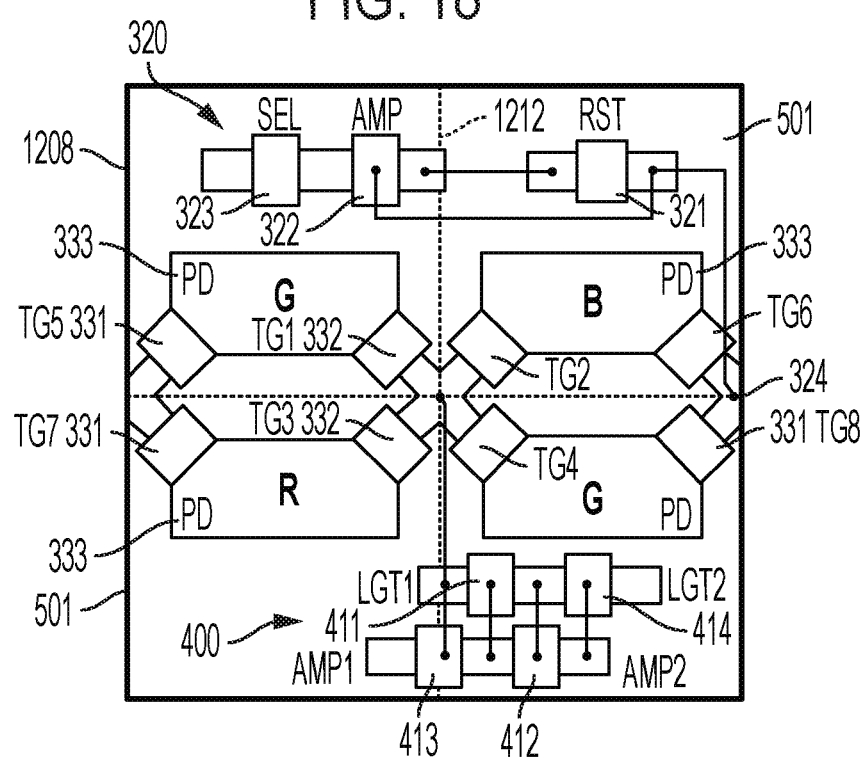
FIG. 19 is a plan view of a configuration of a group of combined event detection and image sensing pixels in accordance with the second exemplary embodiment.

FIG. 19 is a plan view of a configuration of a group of combined event detection and image sensing pixels in accordance with the second exemplary embodiment. In this example, each combined event detection and image sensing pixel 503 includes a photoelectric conversion element 333 that is selectively connected to a shared pixel imaging signal generation readout circuit 320 by a first transmission transistor 331 and that is selectively connected to a shared event detection readout circuit 400 by a second transmission transistor 332. RDTI structures 1212 provide isolation between combined event detection and image sensing pixels 501 within the group, while the group is isolated from unit pixels 310 and other groups by RFTI structures 1208. Where RDTI separation structures 1212 are used, circuit elements or portions of circuit elements, such as an amplification transistor 322 or 413, LG transistor 411, or the like, can be formed adjacent an end of the RDTI structure 1212.

Figure 20:
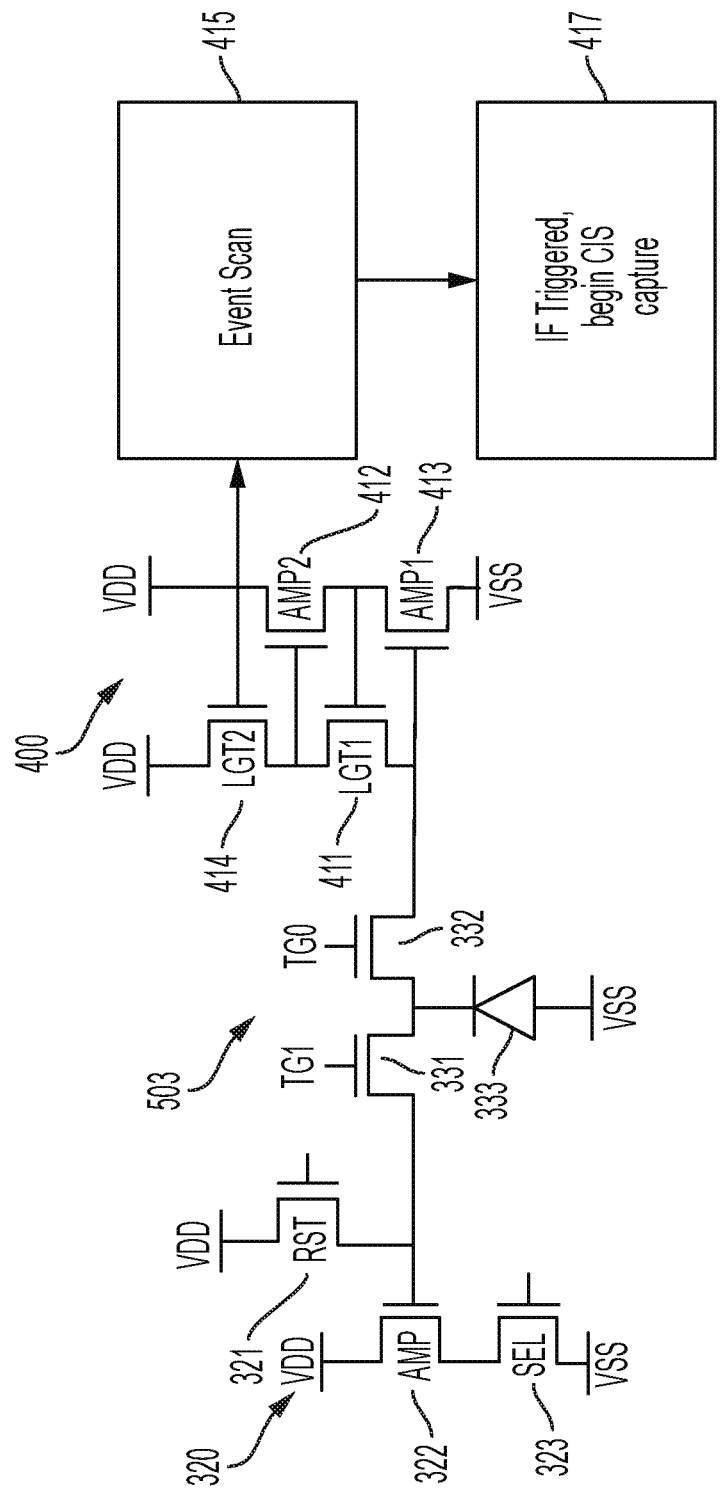
FIG. 20 is a circuit diagram illustrating a schematic configuration example of a combined event detection and image sensing pixel in accordance with embodiments of the present disclosure.

FIG. 20 is a circuit diagram illustrating a schematic configuration example of a combined event detection and image sensing pixel 503 in accordance with embodiments of the present disclosure. In this example, the photoelectric conversion element 333 of the combined event detection image sensing pixel 503 is selectively connected to a dedicated pixel imaging signal generation readout circuit 320 by a first transfer transistor 331, and is selectively connected to a dedicated address event detection readout circuit 400 by a second transfer transistor 332. That is, the pixel imaging signal generation readout circuit 320 and the address event detection readout circuit 400 are not shared with any other photoelectric conversion units 333.

Figure 21A:
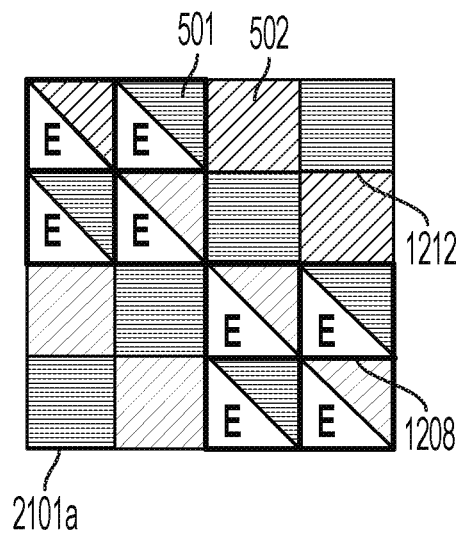
FIG. 21A is a plan view of a portion of a pixel array comprising a group of pixels configured as in a third exemplary embodiment.
Figures 21B, 21C:
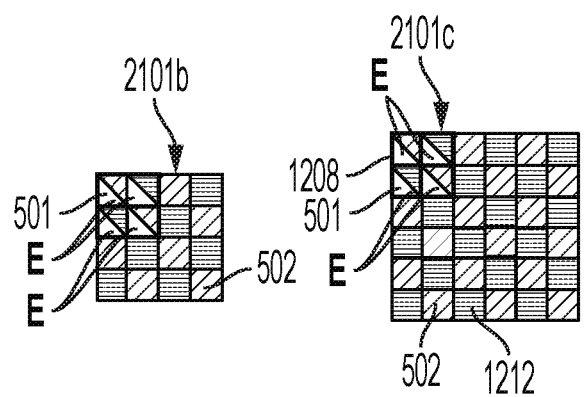
FIG. 21B is a plan view of a portion of another pixel array comprising a group of pixels configured as in the third exemplary embodiment.
FIG. 21C is a plan view of a portion of another pixel array comprising a group of pixels configured as in the third exemplary embodiment.

FIGS. 21A-21C are plan views of portions of a pixel arrays, and in particular subarrays or subsets of pixels 2101 configured as in a third exemplary embodiment. More particularly, in this third exemplary embodiment, groups of combined event detection and image sensing pixels 501 are interspersed in the pixel array 300 with groups of image sensing pixels 502. The groups of combined event detection and image sensing pixels 501 each include four combined event detection and image sensing pixels 501. However, circuit elements are shared. Accordingly, the combined event detection and image sensing pixels 501 can be associated with a readout circuit as illustrated in FIG. 20. The groups of image sensing pixels 502 each include four image sensing pixels 502. The image sensing pixels 502 can share circuit elements and can be configured as depicted in FIG. 5B. In the example subarray 2101a illustrated in FIG. 21A, the ratio of image sensing pixels 502 to combined event detection and image sensing pixels is 1:1. In the example sub-array 2101b illustrated in FIG. 21B, the ratio of image sensing pixels 502 to combined event detection and image sensing pixels 501 is 3:1. In the example subarray 2101c illustrated in FIG. 21C, the ratio of image sensing pixels 502 to combined event detection and image sensing pixels 501 is 8:1. In addition, other ratios are possible. RFTI 1208 separation structures are provided around the groups of combined event detection and image sensing pixels 501, and RFTI 1208 separation structures provide isolation between adjacent combined event detection and image sensing pixels 501 within each group of such pixels. RDTI 1212 separation structures provide isolation between adjacent image sensing pixels 502.

Figures 22A, 22B:
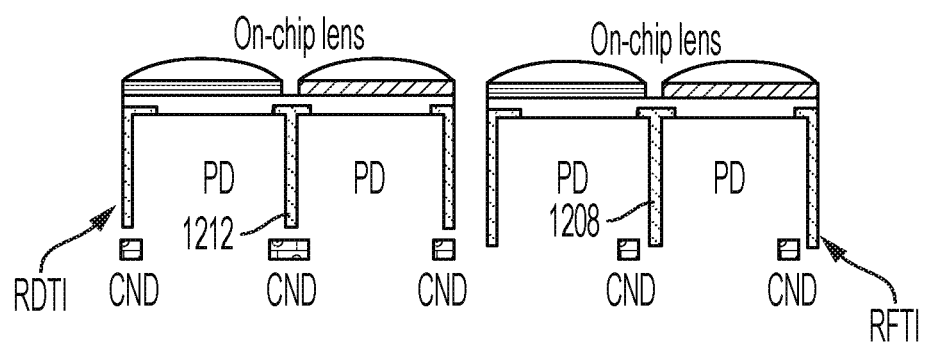
FIG. 22A is a cross sectional view of a portion of a pixel array in accordance with the third exemplary embodiment.
FIG. 22B is a cross sectional view of a portion of another pixel array in accordance with the third exemplary embodiment.

FIG. 22A is a cross sectional view of a portion of a pixel array in accordance with the second exemplary embodiment of the present disclosure. As shown in this example, separation structures 1210 in the form of RDTI structures 1212 can be provided to separate adjacent unit pixels 310. Where RDTI separation structures 1212 are used, circuit elements or portions of circuit elements, such as a floating diffusion 324 or an amplification transistor 322, or the like, can be formed adjacent an end of the RDTI structure 1212. FIG. 22B is a cross sectional view of a portion of another pixel array in accordance with the second exemplary embodiment of the present disclosure. In this additional example, separation structures 1210 in the form of RFTI separation structures 1208 be provided to separate adjacent unit pixels 310.

Figure 23:
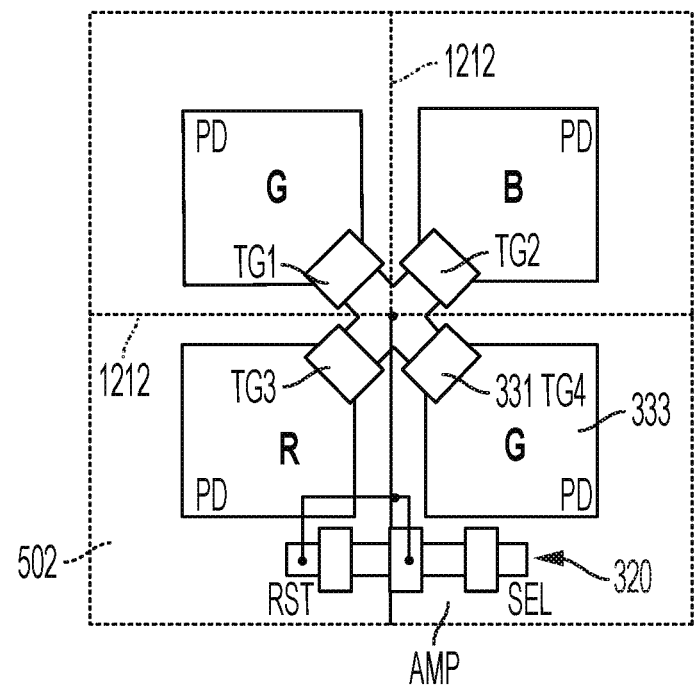
FIG. 23 is a plan view of a configuration of a group of image sensing pixels in accordance with the third exemplary embodiment.

FIG. 23 is a plan view of a configuration of a group of image sensing pixels 502 in accordance with the third exemplary embodiment. In this example, groups 314 of image sensing pixels 502 are separated from one another by RDTI structures 1212. In addition, individual image sensing pixels 502 are separated from one another by RDTI structures, as also illustrated in the examples of FIGS. 21B and 21C. Each image sensing pixel 502 includes a photoelectric conversion element 333 and an associated transfer gate 331. Moreover, in this example, the image sensing pixels 502 within a group 314 share the pixel imaging signal generation unit or readout circuit 320, or portions thereof. For example, the group of image sensing pixels 502 can have a circuit configuration as depicted in FIG. 5B.

Figure 24:
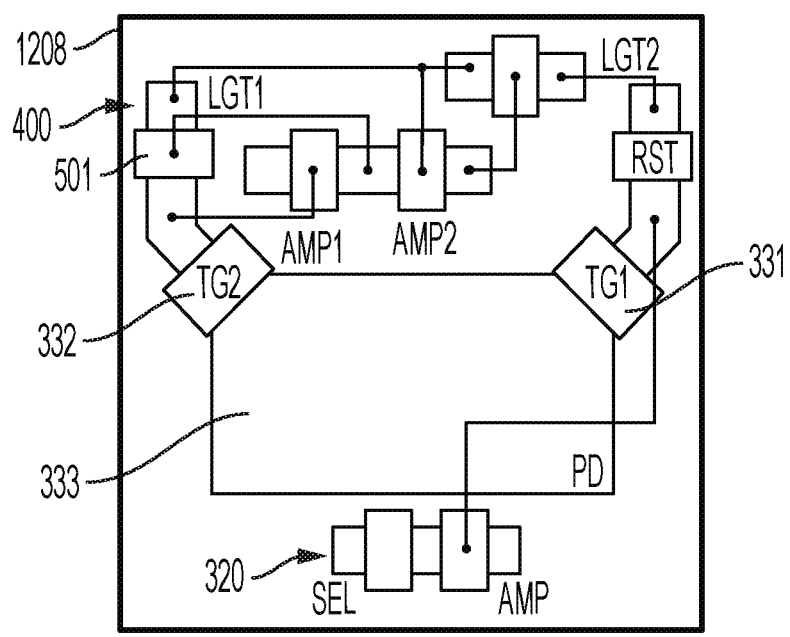
Figure 25:
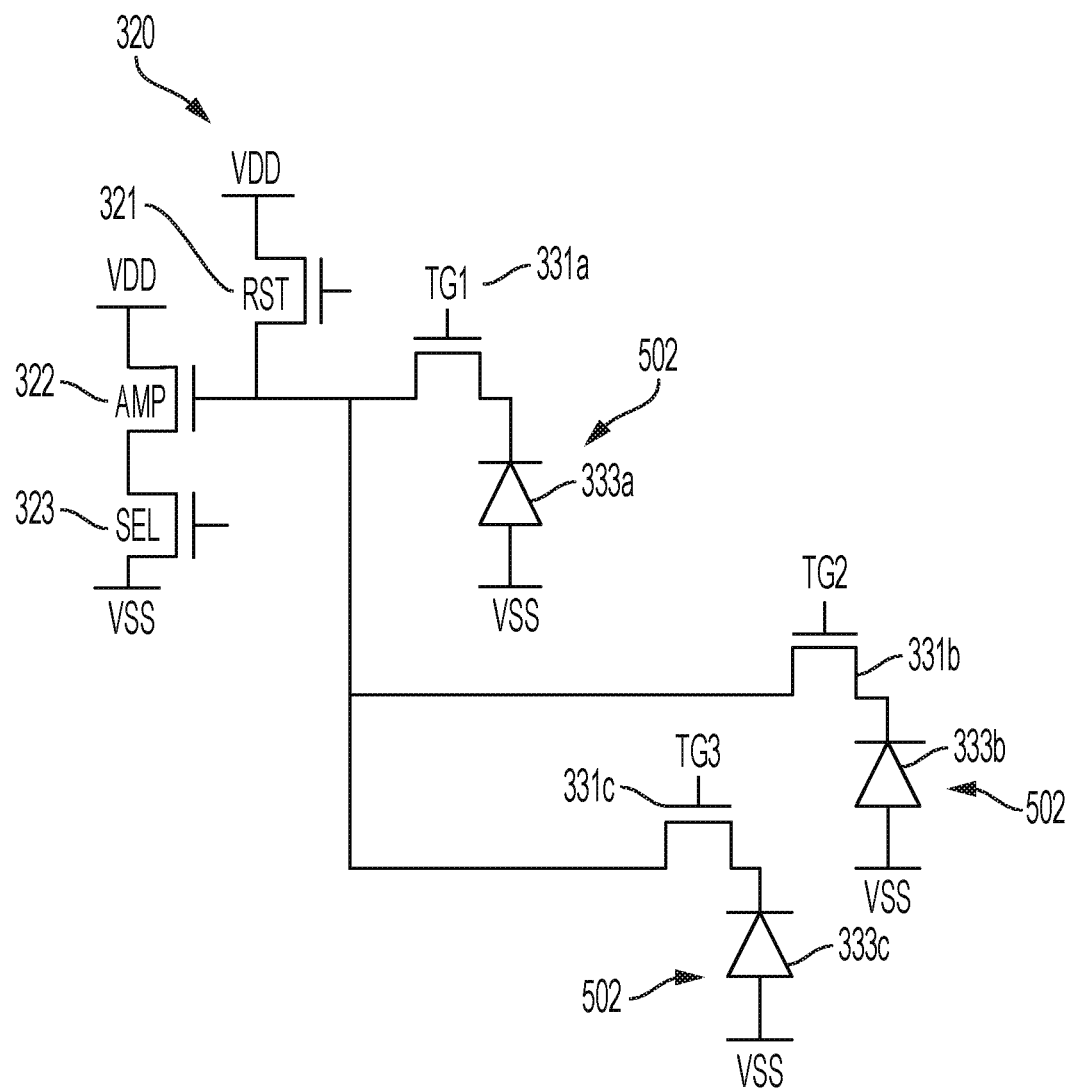
FIG. 25 is a circuit diagram illustrating a schematic configuration example of a group of image sensing pixels in accordance with embodiments of the present disclosure.

FIG. 24 is a plan view of a configuration of a combined event detection and image sensing pixel 501 in accordance with the third exemplary embodiment. In this example, each combined event detection and image sensing pixel 503 includes a photoelectric conversion element 333 that is selectively connected to a pixel imaging signal generation readout circuit 320 by a first transmission transistor 331 and that is selectively connected to an event detection readout circuit 400 by a second transmission transistor 332. Moreover, the electric conversion element 333 of each combined event detection and image sensing pixel 503 does not share its imaging signal generation readout circuit 320 or its event detection readout circuit 400 with any other photoelectric conversion element 333. RDTI structures 1212 provide isolation around each combined event detection and image sensing pixel 501. For example, each combined event detection and image sensing pixel 501 can have a circuit configuration as dep FIG. 25 is a circuit diagram illustrating a schematic configuration example of a group of image sensing pixels 502 in accordance with embodiments of the present disclosure. In this example, the photoelectric conversion elements 333 of a group of three image sensing pixels 502 share a pixel imaging signal generation readout circuit 320. Each of the photoelectric conversion elements 333a-c in the group is selectively connected to the pixel imaging signal generation readout circuit 320 elements by a respective first transfer gate 331a-c.

Figure 26A:
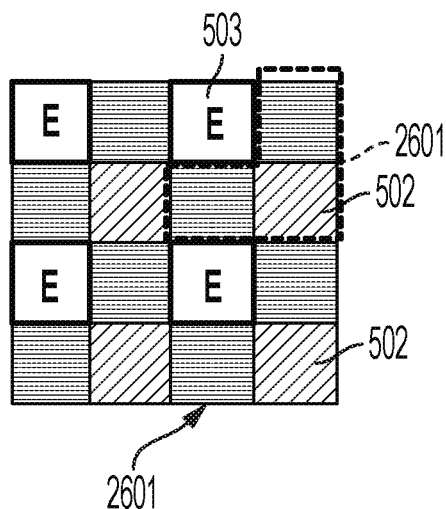
FIG. 26A is a plan view of a portion of a pixel array comprising a group of pixels configured out in a fourth exemplary embodiment.
Figure 26B:
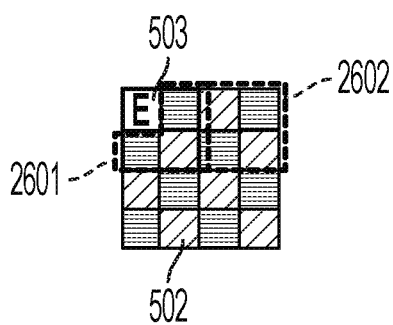
FIG. 26B is a plan view of a portion of another pixel array comprising a group of pixels configured as in the fourth exemplary embodiment.
Figure 26C:
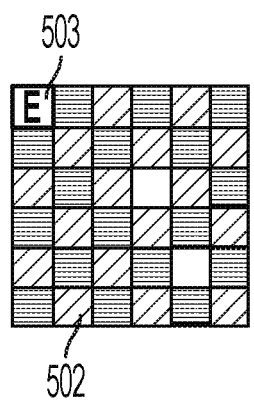
FIG. 26C is a plan view of a portion of another pixel array comprising a group of pixels configured as in the fourth exemplary embodiment.

FIGS. 26A-26C are plan views of a portion of a pixel array comprising subsets of pixels 2601 configured as in a fourth exemplary embodiment. In this fourth exemplary embodiment, a size or area of each imaging sensing pixel 502 is the same or about the same as the size of each event detection pixel 503. In addition, a ratio of image sensing pixels 502 to event detection pixels 503 differs between the various examples. For instance, in the example illustrated in FIG. 26A, the ratio of image sensing pixels 502 to event detection pixels 503 is 3:1. Moreover, the image sensing pixels 502 are disposed in groups of three 2601, while the event detection pixels 503 are disposed singly. In the example illustrated in FIG. 26B, ratio of image sensing pixels 502 to event detection pixels 503 is 15:1. In the example illustrated in FIG. 26C, the ratio of image sensing pixels 502 to event detection pixels 503 is 35:1. In addition, in the examples of FIGS. 26B and 26C, some image sensing pixels 502 are disposed in groups of 3 pixels 2601, and others in groups of 4 pixels 2602.

Figures 27A, 27B:
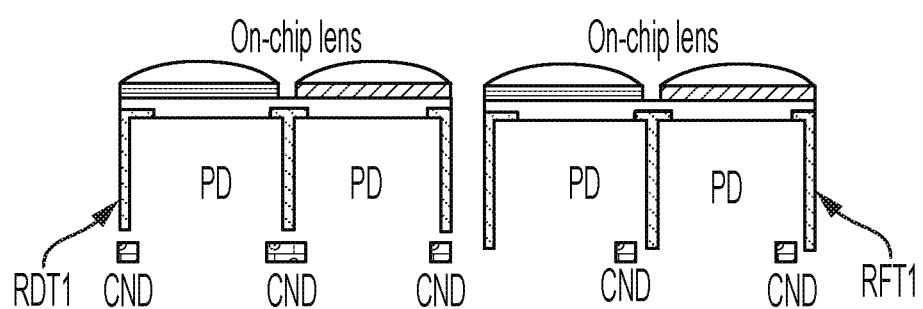
FIG. 27A is a cross-sectional view of a portion of a pixel array in accordance with the fourth exemplary embodiment of the present disclosure.
FIG. 27B is a cross-sectional view of a portion of another pixel array in accordance with the fourth exemplary embodiment of the present disclosure.

FIG. 27A is a cross-sectional view of a portion of a pixel array in accordance with the fourth exemplary embodiment of the present disclosure. As shown in this example, RDTI structures 1212 can be provided to separate adjacent unit pixels 310. FIG. 27B is a cross-sectional view of a portion of another pixel array in accordance with the fourth exemplary embodiment of the present disclosure, in which our FTI structures 1208 separate adjacent unit pixels 310. Where RDTI separation structures 1212 are used, circuit elements or portions of circuit elements can be formed adjacent an end of the RDTI structure 1212.

Figure 28A:
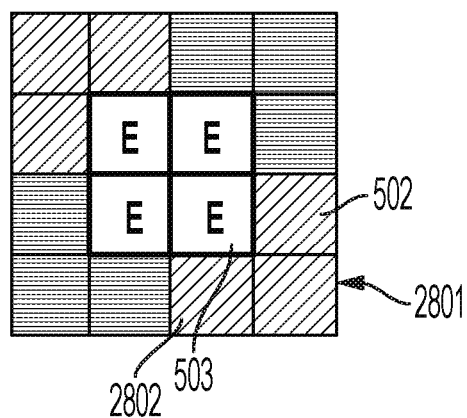
FIG. 28A a is a plan view of a portion of a pixel array comprising a group of pixels configured as in a fifth exemplary embodiment.
Figure 28B:
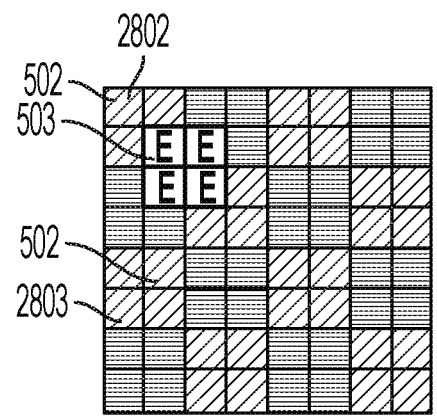
FIG. 28B a is a plan view of a portion of another pixel array comprising a group of pixels configured as in the fifth exemplary embodiment.

In a plan view, the configuration of a group of three image sensing pixels in accordance with the fourth exemplary embodiment can be the same as the configuration in the first embodiment, as illustrated in FIG. 13, except that for groups 2601 of three image sensing pixels 502 the group includes just three photoelectric conversion elements 333 with associated first transmission transistors 331 to selectively connect the photoelectric conversion elements 333 to the shared pixel imaging signal generation readout circuit 320 elements. In addition, groups 314 of image sensing pixels 502 are separated from one another by RDTI structures 1212. In addition, individual image sensing pixels 502 are separated from one another by RDTI structures, as also illustrated in the examples of FIGS. 28A and 28B. Each image sensing pixel 502 includes a photoelectric conversion element 333 and an associated transfer gate 331. Moreover, the image sensing pixels 502 within a group 314 share the pixel imaging signal generation unit or readout circuit 320, or portions thereof. For example, the group of image sensing pixels 502 can have a circuit configuration as depicted in FIG. 5B.

As previously noted, the event detection pixel 503 in the fourth embodiment is the same size as the image sensing pixels 502. The configuration of a combined event detection and image sensing pixel 501 in accordance with the third exemplary embodiment can be the same as or similar to that of the first exemplary embodiment, as illustrated in FIG. 14. Accordingly, each event detection pixel 503 in this embodiment includes a single photoelectric conversion element 333 and address event detection readout circuit 400 components provided for that photoelectric conversion element 333. That is, address event detection readout circuit 400 components are not shared between multiple photoelectric conversion elements 333. In addition, the event detection pixel 503 is isolated from adjacent unit pixels 310 by an RFTI separation structure 1208.

FIGS. 28A-28B are plan views of a portion of a pixel array comprising subsets of pixels 2801 configured as in a fifth exemplary embodiment. In this fifth exemplary embodiment, a size or area of each imaging sensing pixel 502 is the same or about the same as the size of each event detection pixel 503. In a further aspect, image sensing pixels 502 are disposed in groups 2802 or 2803, with each pixel in a group having the same color sensitivity. For instance, the image sensing pixels 502 can be disposed in groups of three unit pixels 2802, as illustrated in FIG. 28A. As another example, the image sensing pixels can be disposed in groups of four unit pixels 2803, except in areas surrounding groups of four event detection pixels 503, where each surrounding group of image sensing pixels 502 is composed of three unit pixels 2802, as illustrated in FIG. 28B. All of the event detection pixels 503 may be disposed in groups of four. As shown, the groups of image sensing pixels 502 may be arrayed so as to combine to form a quad Bayer filter mode, with an overall Bayer pattern formed by pixel sub-sets that include two groups of green image sensing pixels 502, one group of red image sensing pixels 502, and one group of blue image sensing pixels. Some or all of the groups of event detection pixels 503 can be surrounded by groups of image sensing pixels 502 that together form an overall Bayer pattern. In addition, a ratio of image sensing pixels 502 to event detection pixels 503 differs between the various examples. For instance, in the example illustrated in FIG. 28A, the ratio of image sensing pixels 502 to event detection pixels 503 is 3:1. In the example illustrated in FIG. 28B, the ratio of image sensing pixels 502 to event detection pixels 503 is 15:1. In the example illustrated in FIG. 28B, the ratio of image sensing pixels 502 to event detection pixels 503 is 35:1.

Figures 29A, 29B:
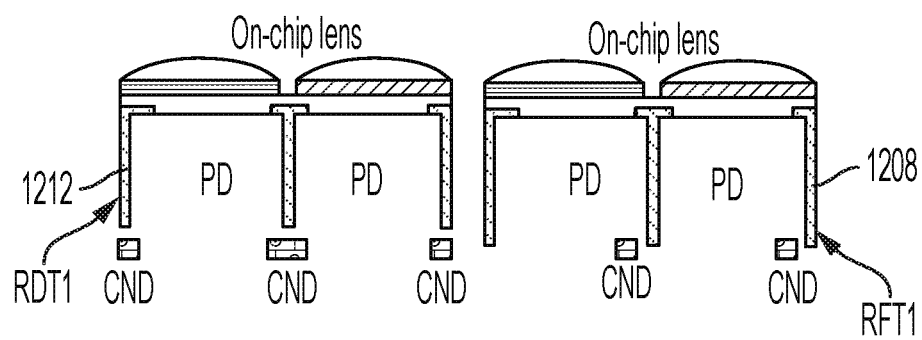
FIG. 29A is a cross-sectional view of a portion of a pixel array in accordance with the fifth exemplary embodiment.
FIG. 29B is a cross-sectional view of a portion of another pixel array in accordance with the fifth exemplary embodiment.

FIG. 29A is a cross-sectional view of a portion of a pixel array in accordance with the fourth exemplary embodiment of the present disclosure. As shown in this example, RDTI structures 1212 can be provided to separate adjacent unit pixels 310. FIG. 29B is a cross-sectional view of a portion of another pixel array in accordance with the fourth exemplary embodiment of the present disclosure, in which RFTI structures 1208 separate adjacent unit pixels 310.

Figure 30:
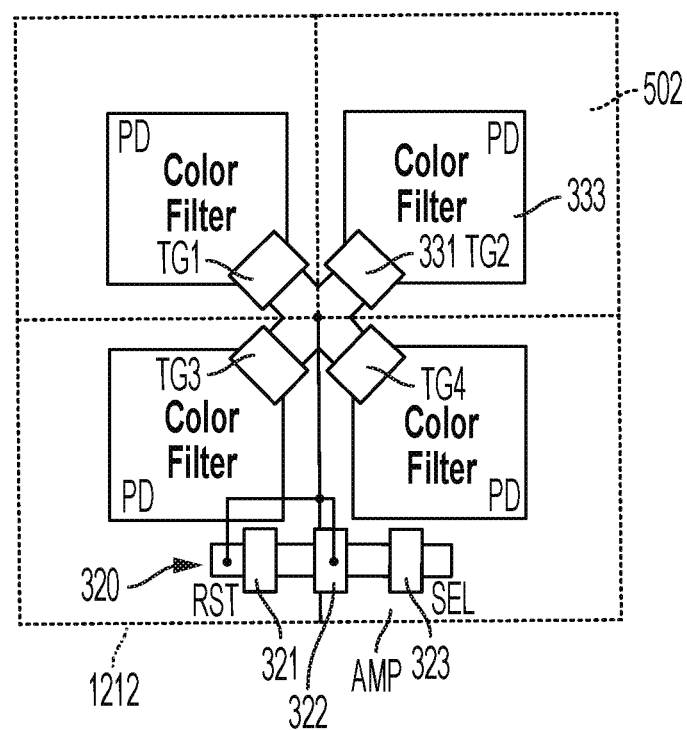
FIG. 30 is a plan view of a configuration of a group of image sensing pixels in accordance with the fifth exemplary embodiment.

FIG. 30 is a plan view of a configuration of a group of image sensing pixels 502 in accordance with the fifth exemplary embodiment. Each photoelectric conversion element 333 within a group is sensitive to the same color. For instance, each photoelectric conversion element 333 within a group of image sensing pixels 502 can be associated with a filter of the same color. In addition, groups 314 of image sensing pixels 502 are separated from one another by RDTI structures 1212, while individual image sensing pixels 502 are separated from one another by RDTI structures. Moreover, in this example, the image sensing pixels 502 within a group 314 share the pixel imaging signal generation unit or readout circuit 320, or portions thereof. For example, the group of image sensing pixels 502 can have a circuit configuration as depicted in FIG. 5B. Where RDTI separation structures 1212 are used, circuit elements or portions of circuit elements, such as a floating diffusion 324 or an amplification transistor 322, or the like, can be formed adjacent an end of the RDTI structure 1212

Accordingly, embodiments of the present disclosure provide imaging devices 100 with pixel arrays 300 that are capable of performing both event detection and imaging operations. Moreover, the circuit elements of any one unit pixel 310 can be optimized for either image sensing or event detection. In accordance with further embodiments of the present disclosure, a pixel array 300 can include pixels that are optimized for image sensing in combination with pixels that perform both image sensing and event detection. In accordance with still further embodiments of the present disclosure, a pixel array 300 can include event detection pixels have a larger area than image sensing pixels. In addition, embodiments of the present disclosure can include different numbers and proportions of image sensing pixels and event detection pixels. For instance, an imaging device 100 may incorporate a pixel array 300 in accordance with embodiments of the present disclosure that has a greater number of image sensing pixels 502 than event detection pixels 503, a greater number of event detection pixels 503 than image sensing pixels 502, or the same number of image sensing pixels 502 and event detection pixels 503. In addition, a pixel array in accordance with embodiments of the present disclosure can include any number and proportion of image sensing pixels 502, event detection pixels 503, and combined event detection and image sensing pixels 501.

Figure 31:
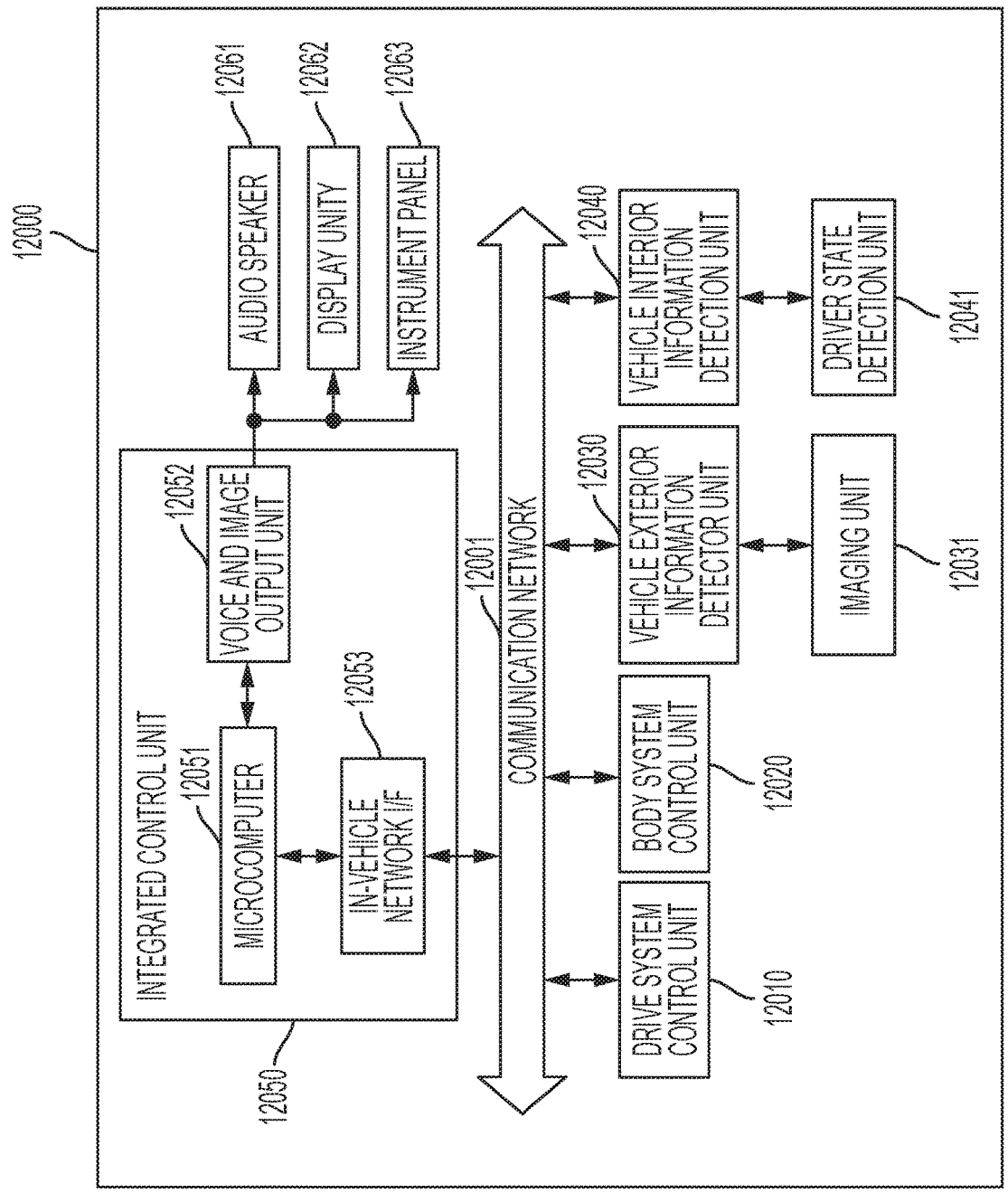
FIG. 31 is a block diagram illustrating an example of a schematic configuration of a vehicle control system.

FIG. 31 is a block diagram illustrating a schematic configuration example of a vehicle control system that is an example of a moving body control system to which the technology according to the present disclosure is applicable.

A vehicle control system 12000 includes a plurality of electronic control units which are connected to each other through a communication network 12001. In the example illustrated in FIG. 31, the vehicle control system 12000 includes a drive system control unit 12010, a body system control unit 12020, a vehicle exterior information detection unit 12030, a vehicle interior information detection unit 12040, and an integrated control unit 12050. In addition, as a functional configuration of the integrated control unit 12050, a microcomputer 12051, a voice and image output unit 12052, and an in-vehicle network I/F (interface) 12053 are illustrated in the drawing.

The drive system control unit 12010 controls an operation of a device relating to the drive system of the vehicle in accordance with various programs. For example, the drive system control unit 12010 functions as a control device of a drive force generation device such as an internal combustion engine and a drive motor which generate a drive force of the vehicle, a drive force transmission mechanism that transmits the drive force to wheels, a steering mechanism that adjusts a steering angle of the vehicle, and a braking device that generates a braking force of the vehicle, and the like.

The body system control unit 12020 controls an operation of various devices which are mounted to a vehicle body in accordance with various programs. For example, the body system control unit 12020 functions as a control device of a keyless entry system, a smart key system, a power window device, and various lamps such as a head lamp, a back lamp, a brake lamp, a blinker, and a fog lamp. In this case, an electric wave that is transmitted from a portable device that substitutes for a key, or signals of various switches can be input to the body system control unit 12020. The body system control unit 12020 receives input of the electric wave or the signals, and controls a door lock device, a power window device, a lamp, and the like of the vehicle.

The vehicle exterior information detection unit 12030 detects information regarding an outer side of the vehicle on which the vehicle control system 12000 is mounted. For example, an imaging unit 12031 is connected to the vehicle exterior information detection unit 12030. The vehicle exterior information detection unit 12030 allows the imaging unit 12031 to capture a vehicle exterior image, and receives the captured image. The vehicle exterior information detection unit 12030 may perform object detection processing of a person, a vehicle, an obstacle, a sign, a character on a load, or the like or distance detection processing on the basis of the image that is received.

The imaging unit 12031 is an optical sensor that receives light and outputs an electric signal corresponding to a light-reception amount. The imaging unit 12031 may output the electric signal as an image or as distance measurement information. In addition, light received by the imaging unit 12031 may be visible light, or invisible light such as infrared rays. Moreover, the imaging unit 12031 can include a a solid-state imaging device 200 incorporating a pixel array unit 300 with the unit pixels 310 configured and isolated from other unit pixels 310 within the pixel array unit 300 in accordance with embodiments of the present disclosure.

The vehicle interior information detection unit 12040 detects vehicle interior information. For example, a driver state detection unit 12041 that detects a driver state is connected to the vehicle interior information detection unit 12040. For example, the driver state detection unit 12041 includes a camera that images a driver, and the vehicle interior information detection unit 12040 may calculate the degree of fatigue or the degree of concentration of a driver on the basis of detection information that is input from the driver state detection unit 12041, or may determine whether or not the driver drowses.

The microcomputer 12051 calculates a control target value of the drive force generation device, the steering mechanism, or the braking device on the basis of vehicle interior or exterior information that is acquired by the vehicle exterior information detection unit 12030 or the vehicle interior information detection unit 12040, and can output a control command to the drive system control unit 12010. For example, the microcomputer 12051 can perform a cooperative control to realize a function of an advanced driver assistance system (ADAS) which includes collision avoidance or impact mitigation of the vehicle, following travel based on an inter-vehicle distance, vehicle speed maintenance travel, vehicle collision alarm, vehicle lane deviation alarm, and the like.

In addition, the microcomputer 12051 can perform a cooperative control for automatic driving and the like in which the vehicle autonomously travels without depending on an operation of a driver by controlling the drive force generation device, the steering mechanism, the braking device, and the like on the basis of information in the vicinity of the vehicle which is acquired by the vehicle exterior information detection unit 12030 or the vehicle interior information detection unit 12040.

The microcomputer 12051 can output a control command to the body system control unit 12020 on the basis of the vehicle exterior information acquired by the vehicle exterior information detection unit 12030. For example, the microcomputer 12051 can perform a cooperative control to realize glare protection such as switching of a high beam into a low beam by controlling the head lamp in correspondence with a position of a preceding vehicle or an oncoming vehicle which is detected by the vehicle exterior information detection unit 12030.

The voice and image output unit 12052 transmits at least one output signal between a voice and an image to an output device capable of visually or aurally notifying a passenger in a vehicle or an outer side of the vehicle of information. In the example in FIG. 31, as the output device, an audio speaker 12061, a display unit 12062, and an instrument panel 12063 are exemplified. For example, the display unit 12062 may include at least one of an on-board display or a head-up display.

Figure 32:
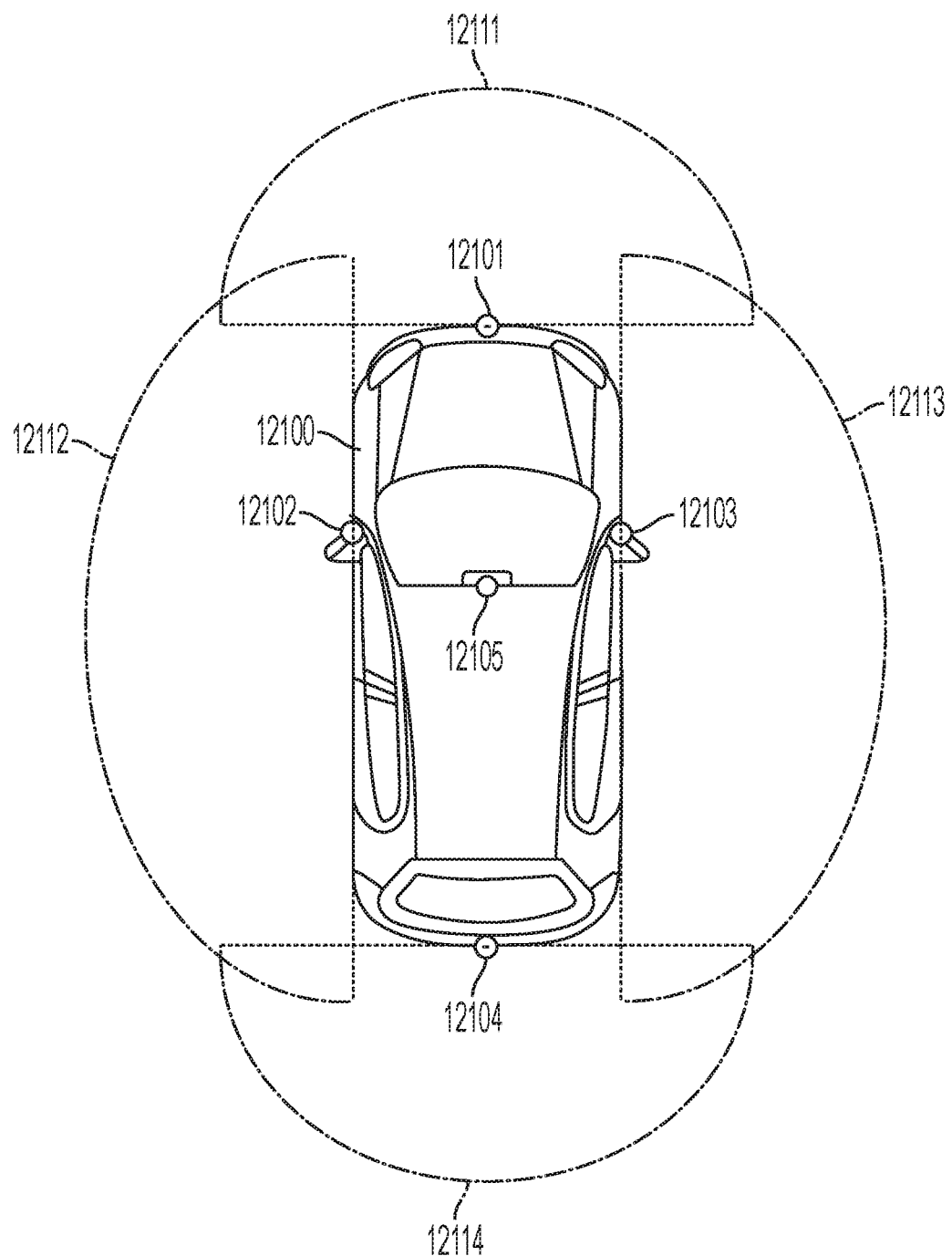
FIG. 32 is a view illustrating an example of an installation position of an out-of-vehicle information detection unit and an imaging unit.

FIG. 32 is a view illustrating an example of an installation position of the imaging unit 12031.

In FIG. 32, as the imaging unit 12031, imaging units 12101, 12102, 12103, 12104, and 12105 are provided.

For example, the imaging units 12101, 12102, 12103, 12104, and 12105 are installed at positions such as a front nose, a side-view mirror, a rear bumper, a back door, and an upper side of a windshield in a vehicle room, of the vehicle 12100. The imaging unit 12101 provided at the front nose, and the imaging unit 12105 that is provided on an upper side of the windshield in a vehicle room mainly acquire images on a forward side of the vehicle 12100. The imaging units 12102 and 12103 which are provided in the side-view mirror mainly acquire images on a lateral side of the vehicle 12100. The imaging unit 12104 that is provided in the rear bumper or the back door mainly acquires images on a backward side of the vehicle 12100. The imaging unit 12105 that is provided on an upper side of the windshield in the vehicle room can be mainly used to detect a preceding vehicle, a pedestrian, an obstacle, a traffic signal, a traffic sign, a vehicle lane, and the like.

Furthermore, FIG. 32 illustrates an example of a photographing range of the imaging units 12101 to 12104. An image capturing range 12111 represents an image capturing range of the imaging unit 12101 that is provided in the front nose, image capturing ranges 12112 and 12113 respectively represent image capturing ranges of the imaging units 12102 and 12103 which are provided in the side-view mirrors, an image capturing range 12114 represents an image capturing range of the imaging unit 12104 that is provided in the rear bumper or the back door. For example, when a plurality of pieces of image data captured by the imaging units 12101 to 12104 are superimposed on each other, it is possible to obtain an overlooking image when the vehicle 12100 is viewed from an upper side.

At least one of the imaging units 12101 to 12104 may have a function of acquiring distance information. For example, at least one of the imaging units 12101 to 12104 may be a stereo camera including a plurality of imaging elements, or may be an imaging element that includes pixels for phase difference detection.

For example, the microcomputer 12051 can extract a three-dimensional object, which is a closest three-dimensional object, particularly, on a proceeding path of the vehicle 12100 and travels in approximately the same direction as that of the vehicle 12100 that travels at a predetermined velocity (for example, 0 km/h or greater), as a preceding vehicle by obtaining distances to respective three-dimensional objects in the image capturing ranges 12111 to 12114 and a variation of the distances with the passage of time (relative velocity to the vehicle 12100) on the basis of the distance information obtained from the imaging units 12101 to 12104. In addition, the microcomputer 12051 can set a distance between vehicles to be secured in advance in front of the preceding vehicle to perform automatic brake control (also including a following stop control), an automatic acceleration control (also including a following acceleration control), and the like. As described above, it is possible to perform a cooperative control for automatic driving in which a vehicle autonomously travels without depending on an operation by a driver, and the like.

For example, the microcomputer 12051 can extract three-dimensional object data relating to a three-dimensional object by classifying a plurality of pieces of the three-dimensional object data into data of a two-wheel vehicle, data of typical vehicle, data of a large-sized vehicle, data of pedestrian, and data of other three-dimensional objects such as an electric pole on the basis of the distance information obtained from the imaging units 12101 to 12104, and can use the three-dimensional object data for automatic obstacle avoidance. For example, the microcomputer 12051 discriminates obstacles at the periphery of the vehicle 12100 into an obstacle that is visually recognized by a driver of the vehicle 12100 and an obstacle that is difficult for the driver to visually recognize. In addition, the microcomputer 12051 determines collision risk indicating the degree of danger of collision with each of the obstacles. In a situation in which the collision risk is equal to or greater than a set value, and collision may occur, the microcomputer 12051 can assist driving for collision avoidance by outputting an alarm to the driver through the audio speaker 12061 or the display unit 12062, or by performing compulsory deceleration or avoidance steering through the drive system control unit 12010.

At least one of the imaging units 12101 to 12104 may be an infrared camera that detects infrared rays. For example, the microcomputer 12051 can recognize a pedestrian by determining whether or not the pedestrian exists in images captured by the imaging units 12101 to 12104. For example, the pedestrian recognition is performed by a procedure of extracting a specific point in the images captured by the imaging units 12101 to 12104 as an infrared camera, and a procedure of performing pattern matching processing for a series of specific points indicating a contour line of an object to determine whether or not the object is a pedestrian. When the microcomputer 12051 determines that a pedestrian exists on the images captured by the imaging units 12101 to 12104, and recognizes the pedestrian, the voice and image output unit 12052 controls the display unit 12062 to overlap and display a quadrangular contour line for emphasis on the pedestrian who is recognized. In addition, the voice and image output unit 12052 may control the display unit 12062 to display an icon indicating the pedestrian or the like at a desired position.

Hereinbefore, description has been given of an example of the vehicle control system to which the technology according to the present disclosure is applicable. The technology according to the present disclosure is applicable to the imaging unit 12031, the driver state detection unit 12041, and the like among the above-described configurations.

Hereinbefore, embodiments of the present disclosure have been described, but the technical range of the present disclosure is not limited to the above-described embodiments, and various modifications can be made in a range not departing from the gist of the present disclosure. In addition, constituent elements in other embodiments and modification examples may be appropriately combined.

In addition, the effects in the embodiments described in this specification are illustrative only, and other effect may exist without a limitation.

Furthermore, the present technology can include the following configurations.

(1) A sensor, comprising:
  a pixel array unit, wherein the pixel array unit includes:
    a plurality of event detection pixels, the plurality of event detection pixels including a first pixel, the first pixel including:
      a first photoelectric conversion region; and
      an amplifier transistor coupled to the first photoelectric conversion region;
    a plurality of image sensing pixels, the plurality of image sensing pixels including:
      a second photoelectric conversion region;
      a third photoelectric conversion region; and
      an amplifier transistor coupled to the second and third photoelectric conversion regions;
    a first isolation region disposed between the first pixel and the second pixel; and
    a second isolation region disposed between the second and third photoelectric conversion regions.

(2) The sensor according to (1), wherein the first isolation region is deeper than the second isolation region in a cross sectional view.

(3) The sensor according to (1) or (2), further comprising:
  a plurality of image signal generation readout circuits, wherein for each photoelectric conversion region of each image sensing pixel an associated transfer transistor selectively couples the photoelectric conversion region to one of the image signal generation readout circuits.

(4) The sensor according to (3), wherein each image signal generation readout circuit is shared by a plurality of image sensing pixels.

(5) The sensor according to (4), further comprising:
  a plurality of event detection readout circuits, wherein each photoelectric conversion region of each event detection pixel is coupled to one of the event detection readout circuits.

(6) The sensor according to (5), further comprising:
  a plurality of second image signal generation readout circuits,
  wherein each event detection pixel further includes a transfer transistor,
  wherein for each photoelectric conversion region of each event detection pixel the associated transfer transistor selectively couples the photoelectric conversion region to one of the second event detection readout circuits.

(7) The sensor according to (6), wherein each second image signal generation readout circuit is shared by a plurality of event detection pixels.

(8) The sensor according to claim 7, wherein each event detection readout circuit is shared by a plurality of event detection pixels.

(9) The sensor according to any of (1) to (8), wherein the plurality of image sensing pixels includes a first number of image sensing pixels, wherein the plurality of event detection pixels includes a second number of event detection pixels, and wherein the first number is greater than the second number.

(10) The sensor according to any of (1) to (9), wherein an area of the photoelectric conversion region of each event detection pixel is greater than an area of the photoelectric conversion region of each image sensing pixel.

(11) The sensor according to (9) or (10), wherein the first number is at least three times greater than the second number.

(12) The sensor according to any of (1) to (11), wherein an area of each event detection pixel is greater than an area of each image sensing pixel.

(13) The sensor according to any of (1) to (12), wherein each event detection pixel is surrounded by a full thickness trench isolation structure.

(14) The sensor according to any of (1) to (13), wherein each image sensing pixel is separated from an adjacent image sensing pixel by a deep trench isolation structure.

(15) The sensor according to any of (1) to (12), wherein each event detection pixel is separated from an adjacent event detection pixel by a deep trench isolation structure.

(16) The sensor according to (15), wherein each event detection pixel is separated from an adjacent image sensing pixel by a full thickness trench isolation structure.

(17) The sensor according to (15) or (16), wherein each image sensing pixel is separated from an adjacent image sensing pixel by a deep trench isolation structure.

(18) An electronic apparatus, comprising:
 an imaging lens; and
 a solid-state imaging device, including:
at least one pixel array unit, wherein the pixel array unit includes:
 a plurality of event detection pixels, the plurality of event detection pixels including:
  a first photoelectric conversion region; and
  an amplifier transistor;
 a plurality of image sensing pixels, the plurality of image sensing pixels including:
  a second photoelectric conversion region;
  a third photoelectric conversion region; and
  an amplifier transistor coupled to the second and third photoelectric conversion regions;
 a first isolation region disposed between the first pixel and the second pixel; and
 a second isolation region disposed between the second and third photoelectric conversion regions; and
 a control unit, wherein the control unit controls operation of the solid-state imaging device.

(19) A method, comprising:
 providing a pixel array unit, wherein the pixel array unit includes:
  a plurality of event detection pixels, the plurality of event detection pixel including:
   a first photoelectric conversion region; and
   an amplifier transistor;
  a plurality of image sensing pixels, the plurality of image sensing pixels including:
   a second photoelectric conversion region;
   a third photoelectric conversion region; and
   an amplifier transistor coupled to the second and third photoelectric conversion regions;
  a first isolation region, disposed between the first pixel and the second pixel; and
  a second isolation region disposed between the second and third photoelectric conversion regions.

It should be understood by those skilled in the art that various modifications, combinations, sub-combinations and alterations may occur depending on design requirements and other factors insofar as they are within the scope of the appended claims or the equivalents thereof

What is claimed is:

1. A sensor, comprising:
 a pixel array unit, wherein the pixel array unit includes:
  a plurality of event detection pixels, the plurality of event detection pixels including a first pixel, the first pixel including:
   a first photoelectric conversion region disposed in a substrate; and
   an amplifier transistor coupled to the first photoelectric conversion region;
  a plurality of image sensing pixels, the plurality of image sensing pixels including:
   a second pixel including a second photoelectric conversion region disposed in the substrate;
   a third pixel including a third photoelectric conversion region disposed in the substrate; and
   an amplifier transistor coupled to the second and third photoelectric conversion regions;
  a first isolation region disposed in the substrate between the first pixel and the second pixel; and
  a second isolation region disposed in the substrate between the second pixel and the third pixel,
  wherein the first isolation region extends deeper into the substrate than the second isolation region in a cross sectional view.

2. The sensor according to claim 1, wherein the second pixel or the third pixel includes a floating diffusion that is overlapped with the second isolation region in plan view, and wherein the first pixel includes a floating diffusion that is not overlapped with the first isolation region in the plan view.

3. The sensor according to claim 1, further comprising:
 a plurality of image signal generation readout circuits, wherein for each photoelectric conversion region of each image sensing pixel an associated transfer transistor selectively couples the photoelectric conversion region to one of the image signal generation readout circuits.

4. The sensor according to claim 3, wherein each image signal generation readout circuit is shared by multiple image sensing pixels.

5. The sensor according to claim 4, further comprising:
 a plurality of event detection readout circuits, wherein each photoelectric conversion region of each event detection pixel is coupled to one of the event detection readout circuits.

6. The sensor according to claim 5, further comprising:
 a plurality of second image signal generation readout circuits,
 wherein each event detection pixel further includes a transfer transistor,
 wherein for each photoelectric conversion region of each event detection pixel the associated transfer transistor selectively couples the photoelectric conversion region to one of the second event detection readout circuits.

7. The sensor according to claim 6, wherein each second image signal generation readout circuit is shared by multiple event detection pixels.

8. The sensor according to claim 7, wherein each event detection readout circuit is shared by multiple event detection pixels.

9. The sensor according to claim 8, wherein the plurality of image sensing pixels includes a first number of image sensing pixels, wherein the plurality of event detection pixels includes a second number of event detection pixels, and wherein the first number is greater than the second number.

10. The sensor according to claim 9, wherein an area of the photoelectric conversion region of each event detection pixel is greater than an area of the photoelectric conversion region of each image sensing pixel.

11. The sensor according to claim 9, wherein the first number is at least three times greater than the second number.

12. The sensor according to claim 1, wherein each event detection pixel responds to a change in light intensity asynchronously, wherein the plurality of image sensing pixels includes a first number of image sensing pixels, wherein the plurality of event detection pixels includes a second number of event detection pixels, and wherein the first number is greater than the second number.

13. The sensor according to claim 12, wherein an area of each event detection pixel is greater than an area of each image sensing pixel.

14. The sensor according to claim 12, wherein an area of the photoelectric conversion region of each event detection pixel is greater than an area of the photoelectric conversion region of each image sensing pixel.

15. The sensor according to claim 12, wherein the first number is at least three times greater than the second number.

16. The sensor according to claim 1, wherein each event detection pixel is surrounded by a full thickness trench isolation structure at a same depth in the substrate as the first isolation region.

17. The sensor according to claim 1, wherein each image sensing pixel is separated from an adjacent image sensing pixel by a deep trench isolation structure at a same depth in the substrate as the second isolation region.

18. The sensor according to claim 17, wherein each event detection pixel is separated from an adjacent event detection pixel by a deep trench isolation structure at a same depth in the substrate as the second isolation region.

19. The sensor according to claim 18, wherein each event detection pixel is separated from an adjacent image sensing pixel by a full thickness trench isolation structure at a same depth in the substrate as the first isolation region.

20. An electronic apparatus, comprising:
an imaging lens; and
a solid-state imaging device, including:
at least one pixel array unit, wherein the pixel array unit includes:
a plurality of event detection pixels, the plurality of event detection pixels including:
a first photoelectric conversion region disposed in a substrate; and
an amplifier transistor;
a plurality of image sensing pixels, the plurality of image sensing pixels including:
a second photoelectric conversion region disposed in the substrate;
a third photoelectric conversion region disposed in the substrate; and
an amplifier transistor coupled to the second and third photoelectric conversion regions;
a first isolation region disposed in the substrate between the first photoelectric conversion region and the second photoelectric conversion region; and
a second isolation region disposed in the substrate between the second photoelectric conversion region and the third photoelectric conversion region,
wherein the first isolation region extends deeper into the substrate than the second isolation region in a cross sectional view; and
a control unit, wherein the control unit controls operation of the solid-state imaging device.

21. A method, comprising:
providing a pixel array unit, wherein the pixel array unit includes:
a plurality of event detection pixels, the plurality of event detection pixel including:
a first photoelectric conversion region disposed in a substrate; and
an amplifier transistor;
a plurality of image sensing pixels, the plurality of image sensing pixels including:
a second photoelectric conversion region disposed in the substrate;
a third photoelectric conversion region disposed in the substrate; and
an amplifier transistor coupled to the second and third photoelectric conversion regions;
a first isolation region disposed in the substrate between the first photoelectric conversion region and the second photoelectric conversion region; and
a second isolation region disposed in the substrate between the second photoelectric conversion region and the third photoelectric conversion region,
wherein the first isolation region extends deeper into the substrate than the second isolation region in a cross sectional view.

\* \* \* \* \*